United States Patent
Pearce et al.

(10) Patent No.: US 7,076,070 B2
(45) Date of Patent: Jul. 11, 2006

(54) MONOLITHIC CLASS D AMPLIFIER

(75) Inventors: Lawrence G. Pearce, Palm Bay, FL (US); Donald F. Hemmenway, Melbourne, FL (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 10/738,590

(22) Filed: Dec. 15, 2003

(65) Prior Publication Data

US 2004/0125968 A1 Jul. 1, 2004

Related U.S. Application Data

(60) Continuation of application No. 09/392,806, filed on Sep. 9, 1999, now abandoned, which is a division of application No. 08/973,769, filed as application No. PCT/US96/08826 on Jun. 5, 1996, now Pat. No. 5,973,368.

(51) Int. Cl.
*H03F 21/00* (2006.01)
*H03F 3/38* (2006.01)
*H03F 3/217* (2006.01)
*H04R 3/00* (2006.01)
*H01L 29/76* (2006.01)

(52) U.S. Cl. .................. 381/120; 381/111; 330/10; 330/251; 257/368

(58) Field of Classification Search .............. 381/120; 330/251

See application file for complete search history.

(56) References Cited

U.S. PATENT DOCUMENTS

| 4,042,839 A | 8/1977 | Araki |
| 4,313,126 A | 1/1982 | Krumm et al. |
| 4,321,428 A | 3/1982 | Seki |
| 4,439,738 A | 3/1984 | Atherton |
| 4,554,512 A | 11/1985 | Aieelo |

(Continued)

FOREIGN PATENT DOCUMENTS

DE 42 09 148 10/1992

(Continued)

OTHER PUBLICATIONS

A. Watson Swager, "Power ICs Weighing The Benefits of Integration", *EDN-Electrical Design News*, vol. 39, No. 14, Newton, MA, Jul. 1994, pp. 68-72, 74, 76, 78, 80,82.

*Primary Examiner*—Laura A. Grier
(74) *Attorney, Agent, or Firm*—Fogg and Associates, LLC; Scott V. Lundberg

(57) ABSTRACT

A monolithic 1.75 is mounted in a speaker cabinet 1.71 to drive the voice coil 1.74 of the speaker 1.70. The monolithic integrated circuit may be a class D amplifier 1.10, and is at least a half-bridge or full bridge power MOSFET device. Structures and process for forming the mos switching devices 2.20 of the bridge driver circuits are disclosed. Also disclosed is the N+ buried layer 4.14 of the QVDMOS transistors 4.43 of the bridge circuits.

23 Claims, 20 Drawing Sheets

U.S. PATENT DOCUMENTS

| | | |
|---|---|---|
| 5,160,896 A | 11/1992 | McCorkle |
| 5,194,821 A | 3/1993 | Brambilla |
| 5,256,893 A | 10/1993 | Yasuoka |
| 5,387,875 A | 2/1995 | Tateno |
| 5,510,753 A | 4/1996 | French |
| 5,594,386 A | 1/1997 | Dhuyvetter |
| 5,629,616 A | 5/1997 | Weggel |
| 5,729,175 A | 3/1998 | Ferrer |
| 5,767,740 A | 6/1998 | Fogg |
| 5,777,362 A | 7/1998 | Pearce |
| 5,805,020 A | 9/1998 | Danz et al. |

FOREIGN PATENT DOCUMENTS

| | | |
|---|---|---|
| EP | 0 525 777 | 2/1993 |
| EP | 0557 253 | 8/1993 |
| EP | 0 655 830 | 5/1995 |
| JP | S267675 | 10/1993 |

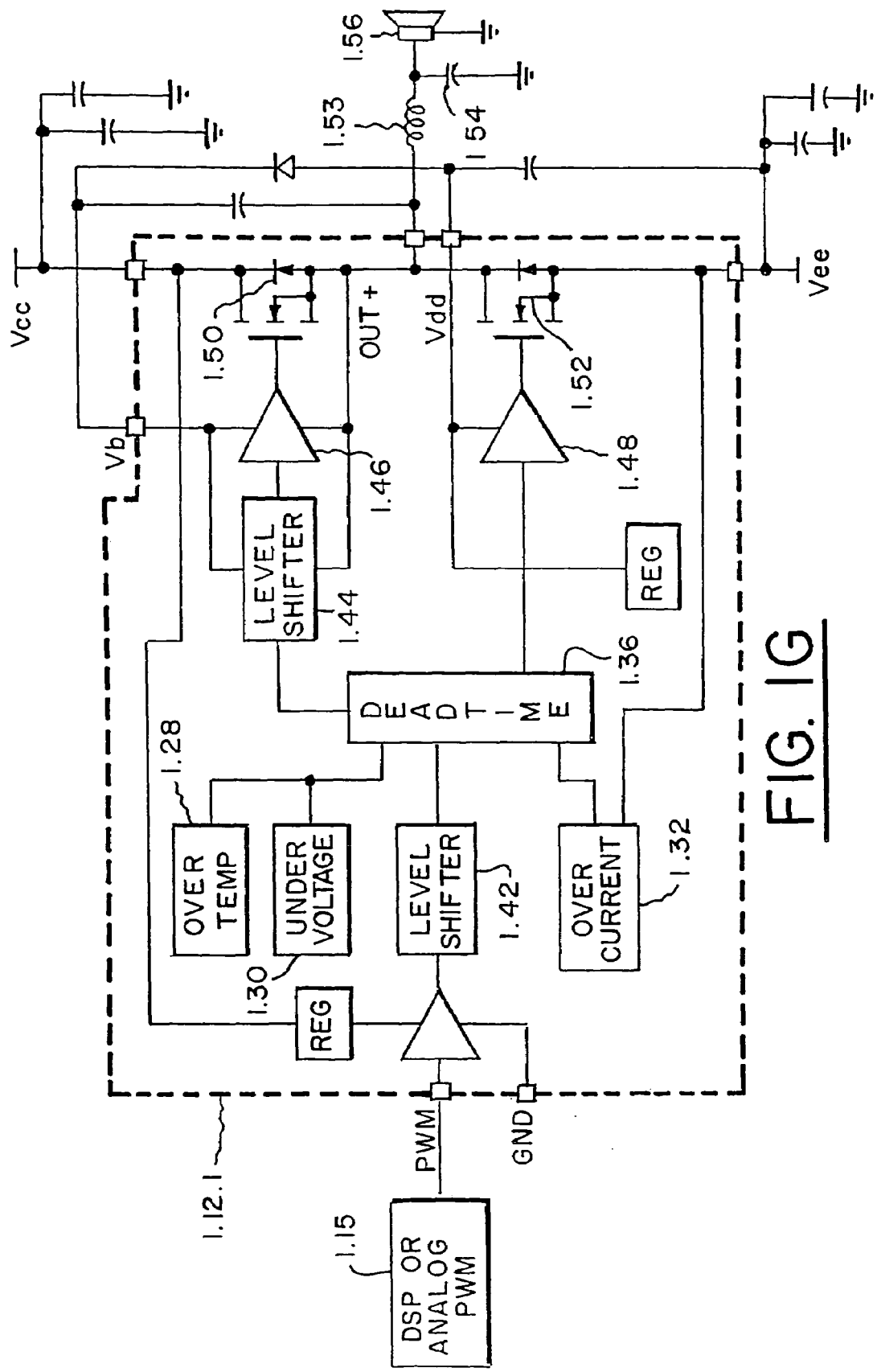
FIG. IG

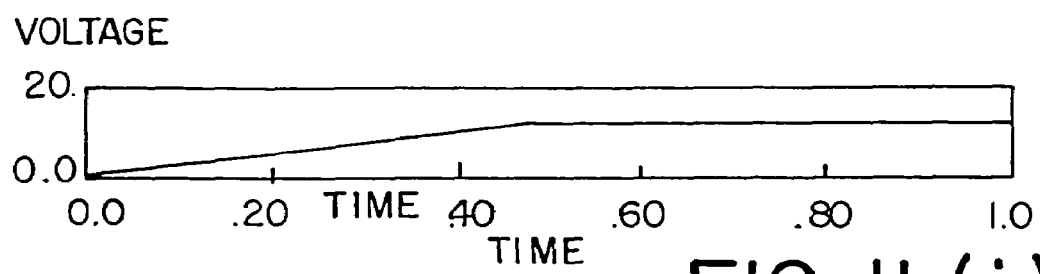
FIG. IL(i)
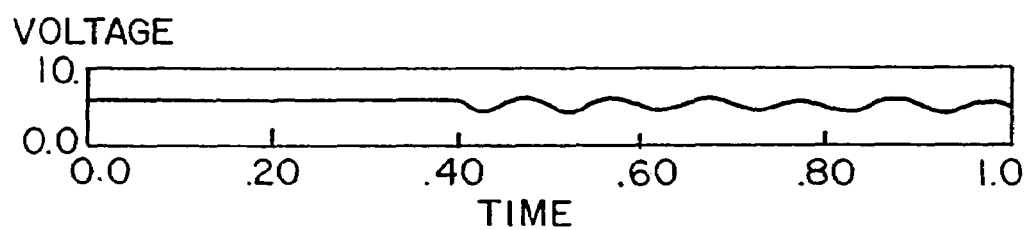
FIG. IL(ii)
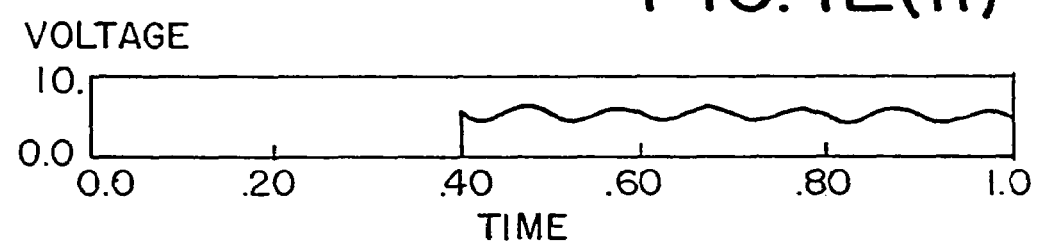
FIG. IL(iii)
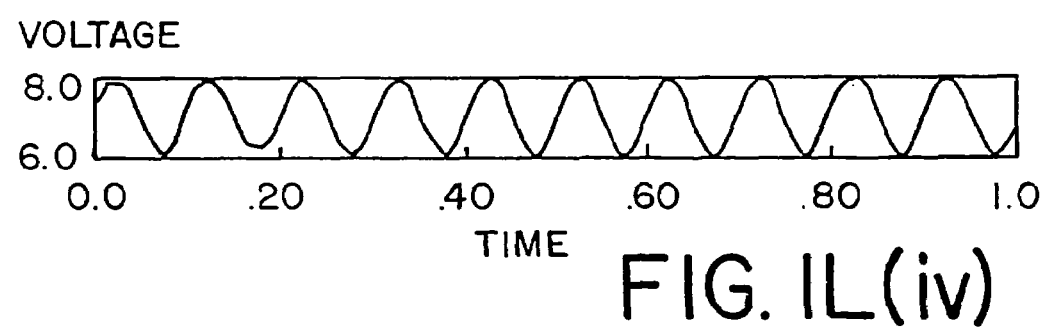
FIG. IL(iv)

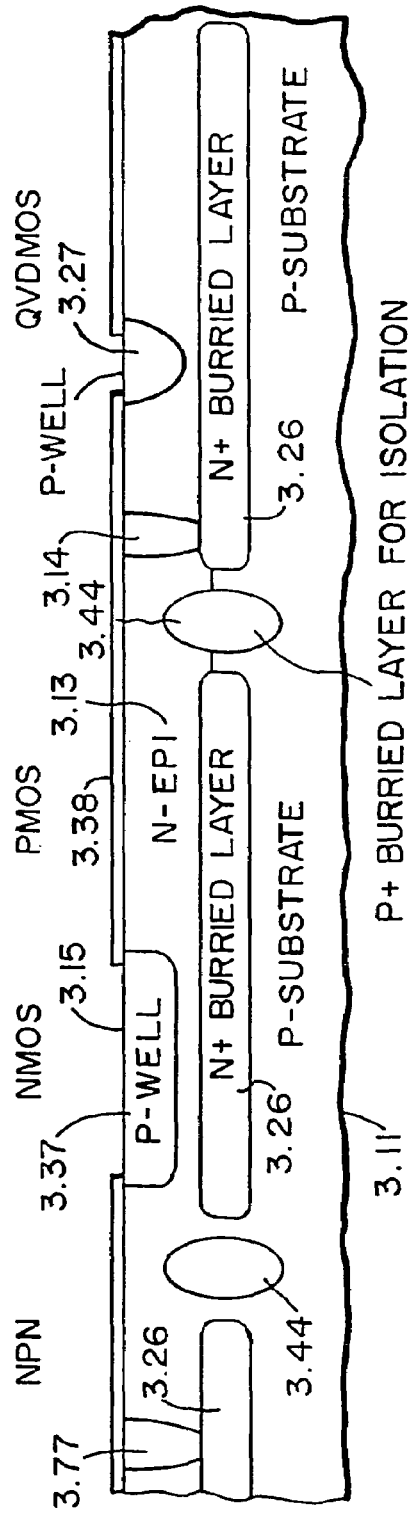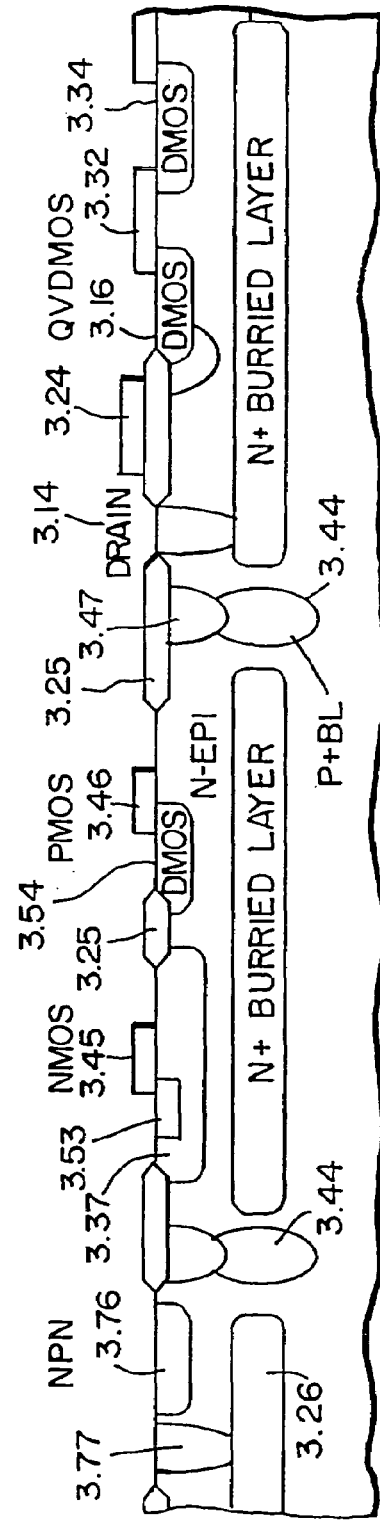

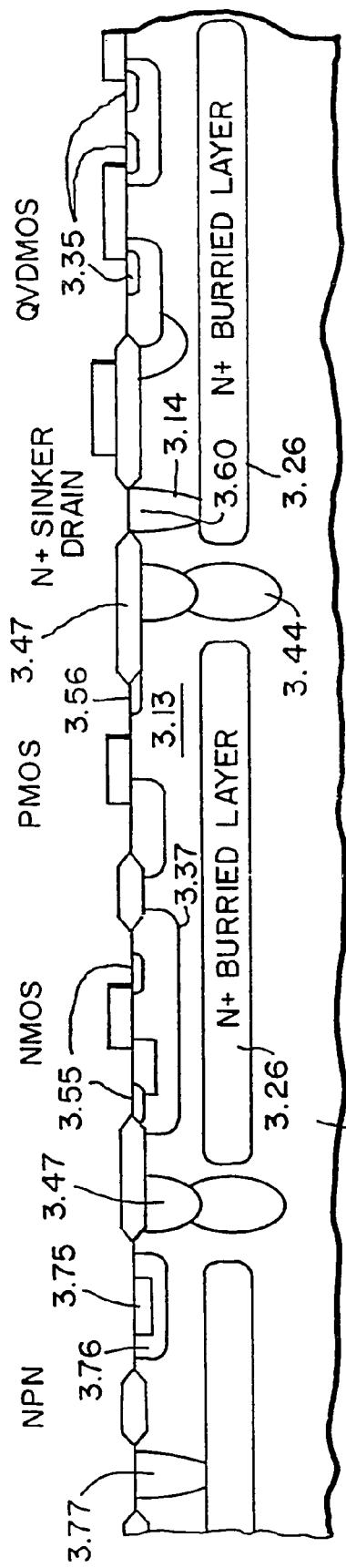
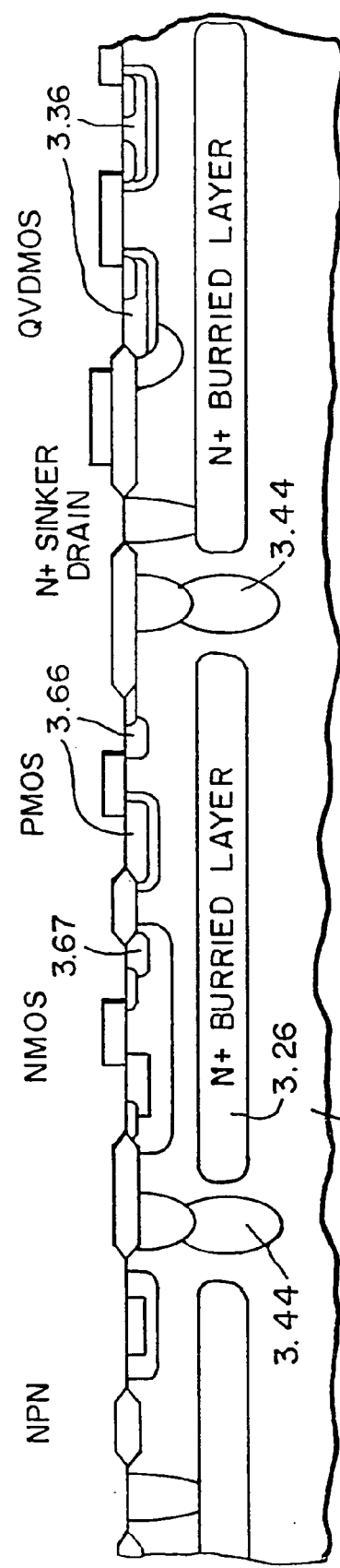
FIG. 3G
FIG. 3H

MONOLITHIC CLASS D AMPLIFIER

CROSS REFERENCE TO RELATED APPLICATIONS

This application is a continuation of U.S. patent application Ser. No. 09/392,806 filed Sep. 9, 1999 now abandoned which is a divisional application of U.S. application Ser. No. 08/973,769, filed Dec. 11, 1997 now U.S. Pat. No. 5,973,368, which is a 371 of International Application No. PCT/US96/08826 filed on Jun. 5, 1996.

INTRODUCTION

Audio Amplifiers

A convention push-pull (class AB) linear amplifier (FIG. 1A) modulates load power by continuously varying conduction through its pass elements during most, if not all, of the conduction cycle. $Q_1$ conducts during the positive half-cycle, and $Q_2$ conducts during the negative. During each half-cycle, the conducting transistor operates in its linear region. The transistor must supply the required current to the load while reducing the voltage between the supply and the load. The power dissipated in the transistor, which equals $V_{BUS}-V_{LOAD})\times I_{LOAD}$, is wasted in the form of heat. $Q_1$ and $Q_2$ have large heat sinks to prevent the output stage from overheating.

The class AB amplifier uses a bleeder circuit to reduce crossover distortion, which occurs during the zero-crossing of the input signal when neither transistor is on (when the input signal is below the $V_{BE}$ of either transistor). See FIG. 1B. The bleeder circuit biases both transistors on during crossover, but the circuit draws current that further reduces the efficiency of the amplifier.

Ballast resistors in class AB designs prevent the transistors from going into thermal runaway. Bipolar transistors are at risk because their $V_{BE}$s have negative temperature coefficients. Usually, the diodes and transistors are mounted on the same heat sink to ensure that the $V_{BE}$s track. The common heat sink helps minimize crossover distortion over temperature.

Other conventional class A, B, and C amplifiers also use switching elements in their linear made of conduction for a large percentage of each cycle of an audio input signal. This linear operation reduces efficiency to about 60% in the typical class AB amplifier and requires the use of large heat similar to dissipate the other 40% of the power.

Alternatively, the switching elements of class D amplifier are either cut off or in saturation most of the time, allowing high efficiencies. The high efficiency translates into reduced heat sinking, smaller size, and lighter weight. Also, class D amplifiers do not suffer from crossover distortion within the audio bandwidth.

The concept of a class D switching amplifier has been known for about 50 years. Early attempts to develop switching amplifiers with vacuum tubes were limited by the tubes' large voltage drops and low current capabilities, which reduce the amplifiers' efficiencies and limited their output power. In the late 1960s, bipolar transistors became a practical alternative to vacuum tubes and allowed the implementation of switching amplifiers with very high efficiencies at low frequencies.

However, an audio switching amplifier requires high-frequency operation, which is generally equal to at least four or five times the bandwidth of the 20-kHz audio spectrum. Higher frequency operation makes it easier to design a filter that removes the carrier frequency before the audio signal drives the speaker. Using bipolar transistors at the required frequency of 80 KHz or greater results in excessive switching losses that eliminate the class D amplifiers' efficiency advantages.

In the 1980's MOSFETs became available that could meet both the switching-speed and conduction-loss requirements to effectively implement class D amplifiers. The first switching amplifiers using MOSFETs incorporated electrically isolated drivers to allow the use of N-channel devices. N-channel MOSFETs yield more efficient designs; these MOSFETs have approximately one-third the conduction losses of their P-channel counterparts. However, the isolated drive circuits were complex and limited the use of switching amplifiers.

Class D amplifiers convert the audio signal into high-frequency pulses that switch the output in accordance with the audio input signal. Some class D amplifier use pulse width modulators to generate a series of conditioning pulses that vary in width with the audio signal's amplitude. The varying-width pulses switch the power-output transistors at a fixed frequency. Other class D amplifier rely upon pulse density modulators. Still other class D amplifiers may rely upon other types of pulse modulators. For heuristic purposes, the following discussion will only refer to pulse width modulators, but those skilled in the art will recognize that class D amplifiers may be configured with other types of modulators. The output of the class D amplifier is fed into a lowpass filter that converts the pulses back into an amplified audio signal that drives the speakers. This design approach produces an amplifier with better than 90% efficiency and that is more complex than its linear counterpart.

The amplifier requires an integrator, a duty-cycle modulator, a switch predrive circuit, and an output filter. The half-bridge class D amplifier using constant-frequency, duty-cycle modulation (FIG. 1C), sums the square-wave output of the switching power transistors with the audio input to provide negative feedback. One cannot take the feedback after the lowpass filter unless one uses a complicated compensation network to handle the phase shift that the filter introduces. A two-pole filter, for example, would introduce a 180° phase shift, which would cause the circuit to oscillate.

The square-wave output is synchronous with the audio input, but one must remove the carrier. The integrator sums the two signals and simulates the effect of the output filter. The circuit feeds the resultant error signal into the duty-cycle modulator, which comprises a comparator and a triangle-wave generator (FIGS. 1D and 1E). Then, the circuit compares the triangle wave to the error signal to produce the modulated output.

The modulated output is a square wave whose duty cycle is proportional to the input signal. In this half-bridge circuit, this output drives the upper and lower power switches in antiphase; the circuit always drives one switch into saturation while it cuts the other off. The square wave causes the switches to change state as fast as possible, given the technology used to implement the switch. Fast switching limits the time that the switches spend in the linear operating region, thereby increasing efficiency and reducing heat generation. The combination of switching and conduction losses defines the upper bound of the amplifier's efficiency.

The circuit filters out the high-frequency square wave that the power switches generate, leaving only the amplified audio signal. This signal then drives a ground-referenced speaker load.

Fabrication processes that allow the integration of high-voltage and logic circuits on one die made possible the first commercially available integrated MOSFET predrivers for class D amplifiers. For example, the Harris HIP4080 provides monolithic isolation and allows the use of high-side N-channel MOSFETs through the use of a bootstrap circuit and an integrated charge pump. The chip integrates a PWM comparator for modulation. This full-bridge driver can switch MOSFETs at frequencies above 1 MHz, reducing the size of magnetics and simplifying the filter design.

However, despite the advances in circuit design and integrated circuit fabrication, there remains a long felt need for a single integrated circuit which combines the class D switching amplifier, power MOSFET drivers and the power MOSFETs themselves. The prior art failed to provide a suitable process that could reliably and economically integrate these circuits. One obstacle in the way of integration is the different power, voltage and current required by the different circuits. Some circuits, such as the class D amplifier, operate at low voltage and low current, e.g., 3–5 volts and less than one amp. Other devices, such as power MOSFETs, operate at voltages of 80 volts or more and carry 10 or more amps of current. Fabrication process for forming devices to handle low voltage and low current are incapable of providing devices that handle high voltage and high current. Prior art power processes capable of forming devices that handle high voltage and high currents generally require device spacing that is too great to integrate the amplifier and driver devices on a common substrate. Accordingly, there remains an unfulfilled need for processes and devices that fully integrate a combined class D audio amplifiers, power drivers and power devices or subcombinations thereof.

Amplifier Start Up.

It is common for class D amplifiers to make a loud thump when the power is turned on. Occasionally this start-up transient is enough to trip the over-current circuitry. Users who desire medium to high fidelity equipment find such start-up transients are not acceptable.

FIG. 1J shows a the schematic of switching audio amplifier. The problem that exists at start-up involves the integrator A1. When the amplifier starts up, latch U1 initially outputs a disabled signal to prevent the bridge from switching until there is sufficient bias voltage. After a delay set by R1, C1, the latch U1 is clocked and the amplifier is enabled. The disable/enable output from U1 is diode or'ed with another signal which detects the presence of an audio input to the amplifier. To conserve power, the 'no input' signal is used to shut off the gate drive signals to the bridge via a bridge driver HIP4080A (an integrated circuit manufactured and sold by Harris Corporation) when there is no input to the amplifier. After start-up, the latched output of U1 is used to disable the amplifier output if an over current is detected. The problem with shutting off the gate drive signals to the output bridge is that there is no longer any feedback to the integrator A1. Under these conditions the integrator saturates at either the positive or negative power supply all depending on the input signal and initial conditions. The thump occurs when the amplifier is re-enabled. The bridge starts switching and the error voltage drives the speaker voltage to full scale instantly. The feedback from the speaker causes the integrator output to be corrected and it slews from its saturated output all to follow the input. This large voltage slew on the integrator and speaker output causes an explosive thump to the speaker. It is desireable to eliminate such thumps.

MOS Drivers

MOS integrated circuits used in power control applications, such as switching power supplies and small motor or actuator drivers, put high demands on the area efficiency of the MOS switches. As a result of these demands, the design of power MOS switches with low resistance becomes crucial to the price competitiveness of an MOS process.

Increasing the specific channel width density of an MOS transistor array would lead to improved efficiency of the device. It would be desirable to take advantage of low resistance in the source-drain regions of a transistor by modifying the configuration of the array to substantially increase its specific channel width density. The present invention achieves this desirable result.

QVDMOS

This invention relates in general to quasi-vertical DMOS devices and, in particular, to a new QVDMOS device and a method for integrating manufacture of a QVDMOS device and QVDMOS array into the manufacture of other MOS and bipolar transistors.

The invention of the integrated circuit made it possible to put many transistors on a single substrate and thereby incorporate complex electrical circuits into a single device. Integrated circuits have found particular application with logic devices and other control circuits that operate at generally low voltages and carry very small currents. However, semiconductor technology is also effective in providing discrete devices for handling very high voltages and very large currents. Discrete devices generally include a vertical current path so that current passes from the surface through the body of the substrate to a contact located on the back of the substrate. Such a vertical current path effectively precludes integration of power devices with other devices. Since the back surface of the substrate is used, there has to be a common contact among all devices on the substrate. Thus, individual transistors on the substrate cannot be effectively isolated from each other. In contrast, many integrated circuits do not use the back side of a substrate for a current path. Instead, integrated circuits normally grow an epitaxial layer on the substrate. The substrate has a buried layer that establishes lateral contact. Surface diffusions down to the buried layer through the epitaxial layer establish the completed circuit.

Accordingly, there has been a long felt need to combine integrated circuits with epitaxial layers and power transistors. In partial fulfillment of this need, there has developed a particular type of power device known as the QVDMOS device. The QVDMOS power device does not use a back contact but instead uses an epitaxial layer, a highly conductive buried layer in the substrate, and a highly conductive sinker diffusion to the buried layer to establish the current path through the QVDMOS.

However, existing QVDMOS technology has many defects that limit its widespread integration with low voltage, low current CMOS logic devices. For example, in a typical QVDMOS array both the source and the body tie must have relatively large areas to accommodate a metal contact. Unless the metal intimately contacts both the source and the body tie over a substantial portion of the surface of the source and the body tie region, the QVDMOS will develop hot spots and will otherwise not be able to carry the current and sustain the relatively high (60 volts) breakdown voltage that is typical and expected of such QVDMOS devices. In order to make intimate contact, existing QVDMOS devices have larger source, larger body tie, and larger body diffusion than are used in CMOS devices. Thus, the relatively large QVDMOS diffusions that are normally made at different concentrations and different ion implant energies render it impractical to incorporate QVDMOS devices together with CMOS and bipolar devices into a single process for manufacturing intelligent power with control logic as well as power handling devices.

Accordingly, there has arisen a long felt need for an effective QVDMOS transistor and method of fabrication that would be compatible with CMOS and bipolar processes so that the QVDMOS transistor and a QVDMOS transistor array could be manufactured simultaneously with CMOS and bipolar transistors.

QVDMOS Buried Layer

The invention of the integrated circuit made it possible to put many transistors on a single substrate and thereby incorporate complex electrical circuits into a single device. Integrated circuits have found particular application with logic devices and other control circuits that operate at generally low voltages and carry very small currents. However, semiconductor technology is also effective in providing discrete devices for handling very high voltages and very large currents. Discrete devices generally include a vertical current path so that current passes from the surface through the body of the substrate to a contact located on the back of the substrate. Such a vertical current path effectively precludes integration of power devices with other devices. Since the back surface of the substrate is used, there has to be a common contact among all devices on the substrate. Thus, individual transistors on the substrate cannot be effectively isolated from each other. In contrast, many integrated circuits do not use the back side of a substrate for a current path. Instead, integrated circuits normally grow an epitaxial layer on the substrate. The substrate has a buried layer that establishes lateral contact. Surface diffusions down to the buried layer through the epitaxial layer establish the completed circuit.

Accordingly, there has been a long felt need to combine integrated circuits with epitaxial layers and power transistors. In partial fulfillment of this need, there has developed a particular type of power device known as the QVDMOS device. The QVDMOS power device does not use a back contact but instead uses an epitaxial layer, a highly conductive buried layer in the substrate, and a highly conductive sinker diffusion to the buried layer to establish the current path through the QVDMOS.

However, existing QVDMOS technology has many defects that limit its widespread integration with low voltage, low current CMOS logic devices. For example, in a typical QVDMOS array both the source and the body tie must have relatively large areas to accommodate a metal contact. Unless the metal intimately contacts both the source and the body tie over a substantial portion of the surface of the source and the body tie region, the QVDMOS will develop hot spots and will otherwise not be able to carry the current and sustain the relatively high (60 volts) breakdown voltage that is typical and expected of such QVDMOS devices. In order to make intimate contact, existing QVDMOS devices have larger source, larger body tie, and larger body diffusion than are used in CMOS devices. Thus, the relatively large QVDMOS diffusions that are normally made at different concentrations and different ion implant energies render it impractical to incorporate QVDMOS devices together with CMOS and bipolar devices into a single process for manufacturing intelligent power with control logic as well as power handling devices.

Accordingly, there has arisen a long felt need for an effective QVDMOS transistor and method of fabrication that would be compatible with CMOS and bipolar processes so that the QVDMOS transistor and a QVDMOS transistor array could be manufactured simultaneously with CMOS and bipolar transistors.

QVDMOS Pilot Transistor

Integrated power devices have fully isolated power DMOS devices, typically in the form of an array. Such an array comprises a number of source cells each with a common gate disposed between a pair of lateral drain diffusions. Underlying the source cells is a buried layer that contacts the drain diffusions. Accordingly, current flows from the source cells into the buried layer and laterally toward the spaced-apart drain regions and then vertically up to the surface of the drain regions.

With power devices it is often desired to provide a pilot transistor that demonstrates substantially identical operating characteristics, albeit on a smaller scale, to the large power device array. So, if the array comprises 100 sources, then it is common to use a single transistor identical to the transistors in the array. The single transistor will be $\frac{1}{100}$th the size of the array and will have operating characteristics including power characteristics proportional to the array.

One solution to the problem has been to use a source pilot that uses one of the embedded source cells. Such a solution is rather simple and depends upon selecting the optimum source cell among the array of sources in the DMOS device. However, it is often desirable to have pilot cell isolated from the source array so that the power in the source array can be effectively monitored by other low power devices such as CMOS control logic. In this way, a relatively low voltage and low power CMOS circuit can use a pilot transistor to monitor the high power of the QVDMOS device. So, the control logic and the pilot transistor can be fabricated on the same circuit yet remain separate. With such an arrangement, the control logic can monitor the power in the QVDMOS power device so that the device can be prevented from unsafe operation.

However, the traditional scaling approach for forming isolated pilot transistors is unsuccessful with power devices having a distributed nature such as an array of QVDMOS sources. By virtue of the distributed nature of the array, merely scaling a single pilot will not mimic the behavior of a large power device.

As such, there is a need for a pilot transistor that accurately matches the performance characteristics of the QVDMOS power device.

SUMMARY OF THE INVENTION

Audio Amplifier

The invention provides in general for a monolithic audio amplifier that converts a low voltage audio signal into a power signal for driving a speaker. The invention provides a monolithic integrated circuit formed on a substrate of semiconductor material and comprising a conditioning circuit for generating a series of class D amplifier conditioning pulses, a bridge driver circuit coupled to output of the conditioning circuit, and a bridge circuit coupled to the output of the bridge driver circuit. The conditioning circuit receives an audio frequency input signal and converts that signal into a plurality of class D amplifier conditioning pulses. For Class D amplifiers with pulse width modulators, the conditioning pulses are pulse width modulated signals where the width of each pulse is portional to the amplitude of the audio signal at the time of the creation of the pulse. Of course, other conditioning pulses may be used, including but not limited to pulse density modulated signals and other pulse modulated signals adaptable to the invention by those skilled in the art. The conditioning pulses pass through level shifters to a bridge or gate driver circuit. The bridge driver circuit contains a plurality of MOS switch transistors that drive one or more gates of power MOSFETs transistors that comprise the bridge circuit. The MOS switch transistors operate at output voltages substantially greater than the output of the class D amplifier. For example, the class D amplifier provides output signals in the range of 3–5 volts and the bridge driver circuit will provide output gate driver signals in the range of about 12 volts. The output signals from the gate driver circuit are applied to the gates of power MOSFETs contained in the bridge circuit. The bridge circuit may be either a half bridge or a full bridge. A half bridge drives the speaker between a ground or reference potential and a high voltage. A full bridge drives a speaker in both directions from a central or neutral ground position to a high referenced voltage or to a low referenced voltage. The power MOSFETs require a gate driver signal of approximately 12 volts in order to switch the power MOSFETs on or off. The power MOSFETs themselves are suitably connected between high voltage supplies and may provide between 60–100 volts and up to 20 or more amps of current for driving speakers.

With the improved device structures and fabrication processes described herein, the monolithic integrated circuit audio amplifier contains both logic and power devices on a single substrate which is capable of handling signals in the 3–5 volt range as well as apply power to the speaker in a range of 60–80 volts and 20 or more amps. The improved processes and structures are further described herein as the MOS switches which are used to form the gate drivers of the monolithic integrated audio amplifier. The QVDMOS transistors form the power MOSFETs of the integrated audio amplifier. The power MOSFETs have a low resistance buried layer as also described hereinafter. Finally, QVDMOS pilot transistors are provided. These pilot transistors are normally used to monitor the output voltage and current of the power MOSFETs. So, the pilot transistors may be used to provide control functions over the power MOSFETs in accordance with further control logic circuitry contained in the monolithic audio amplifier.

The monolithic audio amplifier has control circuitry for monitoring the temperature, voltage current and operation of the bridge circuit. Special logic circuitry is provided to monitor the output current and to shut the QVDMOS bridge off if the current exceeds predetermine limits. Likewise, further logic circuitry monitors the operating voltage of the power QVDMOS devices and inhibits their operation if there is insufficient voltage available. The temperature control circuit monitors the temperature of the QVDMOS power devices and prevents their operation if predetermined temperature limits are exceeded. A deadtime logic control circuitry is disposed between the conditioning circuit and the gate drivers. The deadtime control circuitry monitors the status of the QVDMOS bridge transistors. The deadtime circuitry ensures that no two transistors in the same leg of a bridge are on at the same time. Should that occur, the two transistors would be shorted across the load and would rapidly destroy themselves. The deadtime control circuitry ensures that there is a small amount of time between the time when one QVDMOS transistor in a leg of the bridge goes off and the other QVDMOS transistor in the leg of the bridge turns on.

The invention further contemplates subcombination integrated circuits including an integrated circuit comprising the conditioning circuit and the bridge drivers. The amplifier driver integrated circuit would be separately connectable to another integrated circuit that contains the QVDMOS bridge transistors. The invention contemplates another subcombination integrated circuit. For example, the gate driver circuit and the power QVDMOS transistors may be integrated together into a single device. Then, a separate integrated circuit containing a class D audio amplifier conditioning circuit could be coupled to the integrated bridge driver/bridge circuit. Finally, the invention also contemplates separately forming integrated circuits for the main components of the monolithic audio amplifier. So, separate integrated circuits would be provided for each of the conditioning circuit, bridge drivers, and QVDMOS bridges.

The invention contemplates providing an active speaker for audio systems. The active speaker would have at least a QVDMOS bridge circuit attached to the speaker and responsive to bridge driver signals for driving the speaker. The active speaker may have its own power supply or may be supplied power by the bridge driver signals. In either case, the bridge can be properly sized to the speaker thereby more precisely matching the bridge to the speaker. In prior art designs, the bridges are normally oversized so that they can drive one or more sets of different speakers. With the invention, if the speakers are actively driven by their own bridges, then there is no waste of power in oversizing bridge circuits to small speakers. Likewise, even very large speakers could be driven by relatively small amplifiers since the speakers themselves would carry their own drivers.

Audio Amplifier Silent Start

This invention describes two embodiments of the solution to the problem of start-up thumps. The first embodiment operates on the control loop integrator to correct the problem. The second embodiment operates on the PWM comparator to correct the problem. These embodiments are shown in FIGS. 1J and 1K, either one by itself would be sufficient to eliminate the start-up transient.

MOS Drivers

In accordance with the invention, a power MOS switch comprises an array of MOS devices that comprise alternating drain columns and source columns. Each drain column comprises a plurality of separate drain regions that are closely spaced one from another, and each source column comprises a continuous narrow elongated source distribution region that extends the length of the column. A plurality of narrow source distribution branch regions are connected to the elongated region and extend transversely from the elongated region at least partially between each separate drain region in each drain column adjacent to the source column. A gate region separates the drain regions in each column from the adjacent source distribution regions.

Also in accordance with the invention, the gate region comprises doped silicon, preferably a self-aligned metal silicide layer. Most preferably, the metal silicide is platinum silicide.

The power MOS switch of the invention further comprises a drain contact situated within each drain region and a source contact situated in each of the areas of intersection of the narrow elongated source distribution region with the transverse narrow branch regions. This configuration serves to minimize cell area while maximizing specific channel width.

QVDMOS

The invention provides a quasi-vertical DMOS transistor (QVDMOS) together with a method for its manufacture either alone or in combination with other transistors such as PMOS transistors, NMOS transistors and bipolar transistors. The QVDMOS transistor is constructed on the substrate of a first type of conductivity, usually P-type material. The substrate has a highly doped buried layer of a second or N-type conductivity. An epitaxial layer is disposed above the buried layer and comprises a light doping of a second or N-type conductivity. A drain sinker region of heavily doped second or N-type conductivity extends from the surface of the epitaxial layer to the buried layer. A body region of a first or P-type conductivity is formed in the surface of the epitaxial layer and space from the drain. A source region, preferably an annular source region, is formed in the body region. The source region is formed with a shallow implant of a second or N-type conductivity and has a relatively shallow depth. A body tie is formed in the opening in the source region and has a first or P-type conductivity. The depth of the body tie is slightly greater than the depth of the source region. The body tie extends beneath the source region but not beyond the source region and thereby reduces the pinching effect between the N epi layer and the N-type source region. A gate is disposed over the source region of the body region for selectively establishing a current path from the drain to the source. The gate is provided with sidewall spacers that are used to position the body tie diffusion so that the outer limits of the body tie diffusion are less than the outer limits of the source diffusion. The source and body tie regions are silicided thereby greatly reducing the size of the diffusions needed for the source and the body tie as well as reducing the size of the opening needed to contact the source and the body tie. In a similar manner, the gate, typically made of polysilicon, is also silicided.

It is contemplated that the inventive QVDMOS device may be fabricated simultaneously with other transistors including NMOS transistors, PMOS transistors and bipolar transistors. Such fabrication of a power DMOS together with lower power logic and control transistors is highly desirable. It enables the user to have both the controls and logic for a circuit on the same substrate as the power devices that handle large currents. In such an integrated power and logic circuit, often referred to as an intelligent power circuit, the inventive QVDMOS can be readily integrated into the normal process flow of the CMOS and bipolar transistors without requiring separate steps. In particular, during the formation of the NMOS P well, it is possible to simultaneously form the source-drain P well termination for the QVDMOS device. Likewise, the typical N+ sinker for the QVDMOS drain may also form the surface collector contact for a bipolar transistor. Later in the process, the P-type implant used to form the QVDMOS body may also simultaneously form the lightly doped drain portions of the PMOS transistors and can also be used to provide the base of the bipolar transistor. The shallow N+ implant that forms the source of the QVDMOS transistor simultaneously forms the shallow N+ body tie for the PMOS transistor, the shallow sources and drains for the NMOS transistors. That shallow N+ implant may also form the emitter of the bipolar transistor. Finally, the shallow P+ body tie for the QVDMOS body may also be used to form the source and drain of the PMOS devices as well as the body tie for the NMOS devices.

Having thus summarized the invention, those skilled in the art are referred to the attached drawings and the following detailed description for a further understanding of the invention.

QVDMOS Buried Layer

The invention provides a monocrystalline semiconductor substrate having an integrated circuit formed in an epitaxial layer that is disposed over a buried layer. The buried layer comprises ions of a size approximately the size of the atoms of the semiconductor material. The buried layer has a sheet resistance less than 15 ohms per square and preferably around 6.5 ohms per square. Over the buried layer and in the epitaxial layer there are a number of devices including devices selected from the group consisting of bipolar transistors, quasi-vertical DMOS transistors, and junction barrier Schottky diodes.

The invention provides for a method of forming integrated circuits on a substrate with a low sheet resistance buried layer in a semiconductor substrate. The semiconductor substrate is chosen to have a monocrystalline lattice structure and is preferably a silicon monocrystalline structure. Ions having approximately the same size as the atoms of the semiconductor are implanted with a high dose and low energy. In a preferred embodiment, where silicon is the semiconductor, the ion chosen for implantation is arsenic. The implanted device is then heated to anneal damage to the lattice of the semiconductor and to diffuse the implanted ions into the substrate. After annealing, the substrate is masked and a second implant of a different type may be made. For example, if the first implant was of N-type ions, then the second implant would implant P-type ions to form a P-type buried layer. A typical P-type implant would be boron. After the substrate is annealed in order to heal the damage to the lattice of the semiconductor substrate, some of the damaged area is removed by a suitable etch. During the growth of the epitaxial layer, the substrate is placed into a chamber where free dopant atoms are removed and the epitaxial layer is grown at a temperature suitable to reduce the likelihood of incorporation of the free ions into the epitaxial layer. As a result of the invention, the buried layer has a sheet resistance as low as 6.5 ohms per square and an epitaxial layer may be grown without defect.

Having thus summarized the invention, a further understanding may be gained from reading the detailed description in connection with the drawings.

QVDMOS Pilot Transistor

The invention provides a pilot transistor for a QVDMOS power device. The QVDMOS power device has an array of source cells disposed between opposing drain termination regions at opposing drains. The pilot transistor comprises a source region having a source substantially identical to the sources in the source array of the QVDMOS device. The source array is surrounded by a gate termination region having features similar to the portion of the gate surrounding the source cell in the power DMOS device. The source has a body or P-well region substantially identical to the P-well region of the QVDMOS device. Beneath the P-well region is a buried layer that is substantially identical in sheet resistance to the buried layer of the QVDMOS device. A surface drain region makes contact with the buried layer. The drain region may be identical in doping to the drain region of the QVDMOS device. In addition, it has been found necessary to add an additional resistance in series with the drain region in order to compensate for current spread. Current spread occurs in the pilot transistor because the single source cell does not have adjacent sources to confine the current from the source in its transit to the buried layer. As such, the pilot cell has effectively a lower resistance between the source and the buried layer than did the source cells of the power DMOS device. Such a reduction in resistance is compensated by adding an additional resistance in series with the pilot drain region or by modifying the resistance of the pilot drain region to account for both the resistance of the drain and the added compensating resistance. It is also compensated by using the symmetry of the source array to terminate the pilot gate and shape the pilot drain region.

BRIEF DESCRIPTION OF THE DRAWINGS

Switched Audio Amplifier

FIG. 1G is a circuit diagram of an audio integrated circuit that receives a pulse width modulated input signal and has a combined, monolithic bridge driver and half bridge circuit;

FIG. 1I is circuit diagram of a monolithic audio integrated circuit class D amplifier with left and right channel inputs and outputs;

FIGS. 1L(i)–1L(iv) are wave form diagrams of the voltage signals for the circuit of FIG. 1K;

MOS Drivers

Figure 2A:
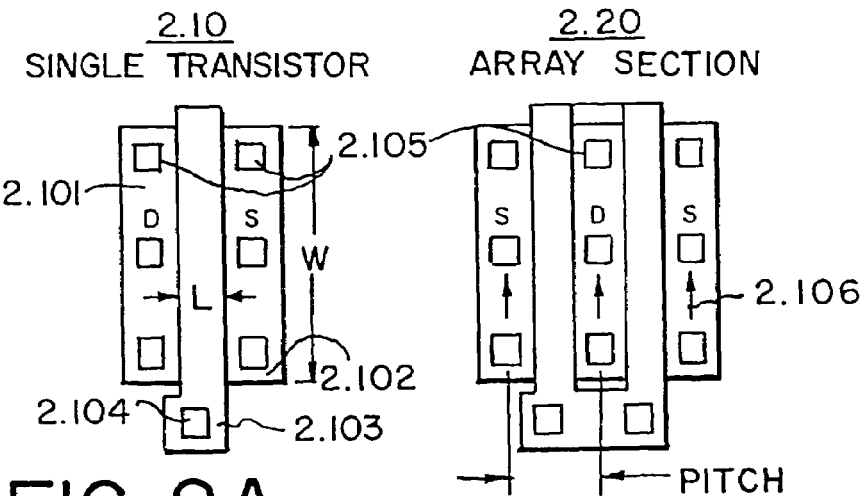
Figure 2B:
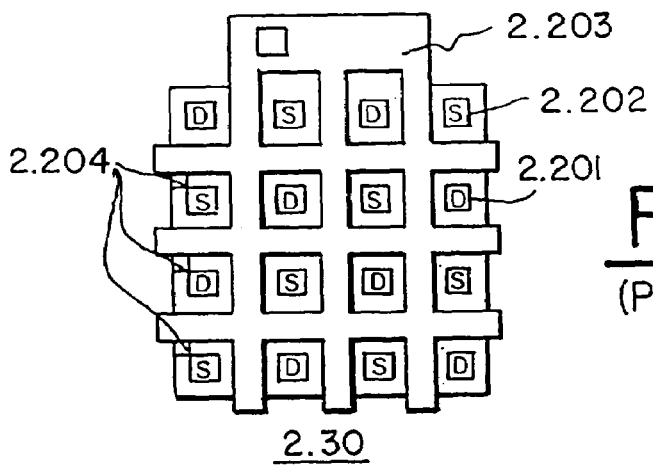
Figure 2C:
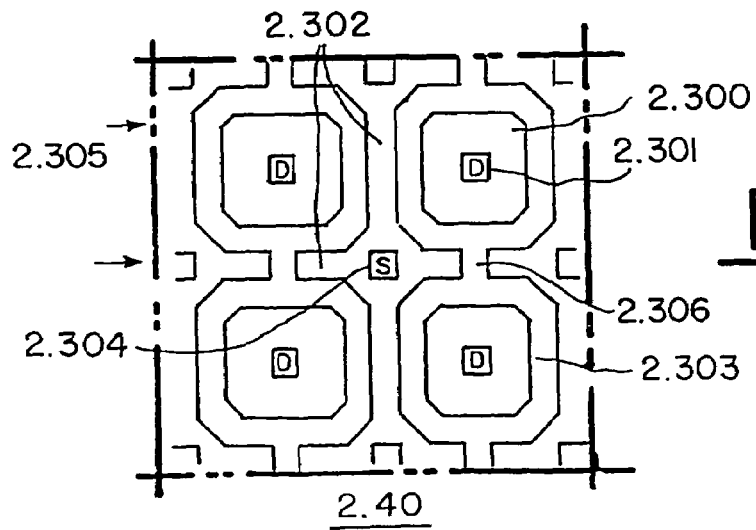

FIG. 2A is a schematic diagram of a prior art linear gate MOS transistor array;

FIG. 2B is a schematic diagram of a prior art "checker board" transistor array;

FIG. 2C is a schematic diagram of a power MOS switch of the present invention.

QVDMOS

Figure 3A:
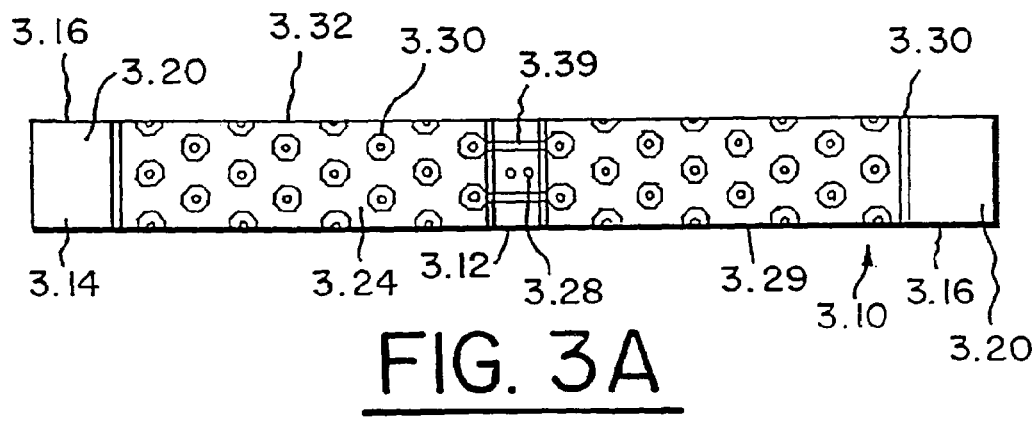
Figure 3B:
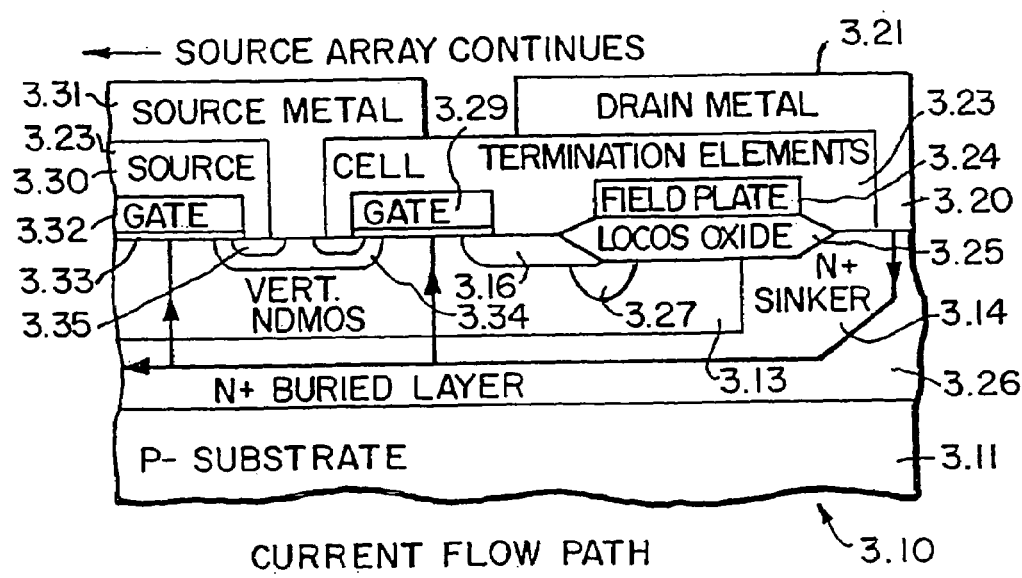
Figure 3C:
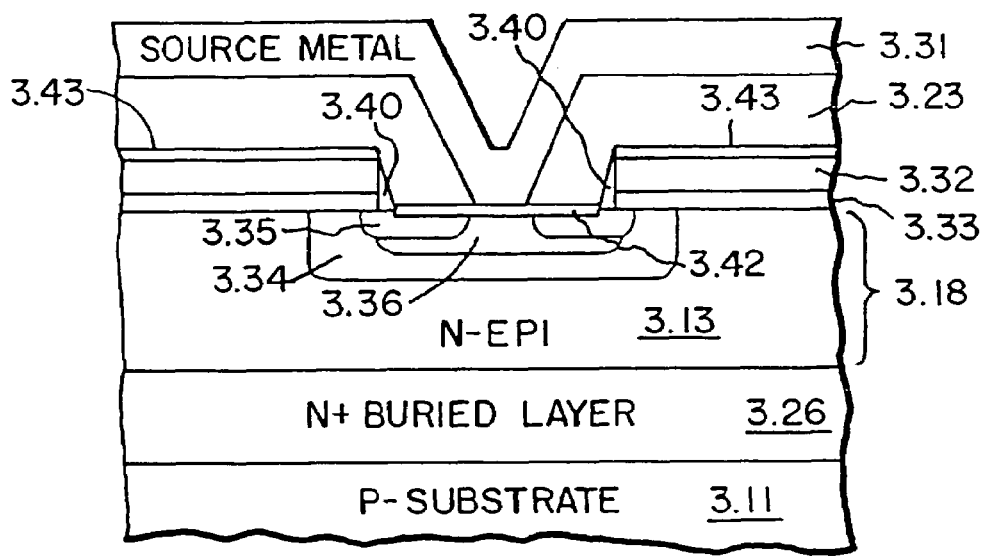
Figure 3D:
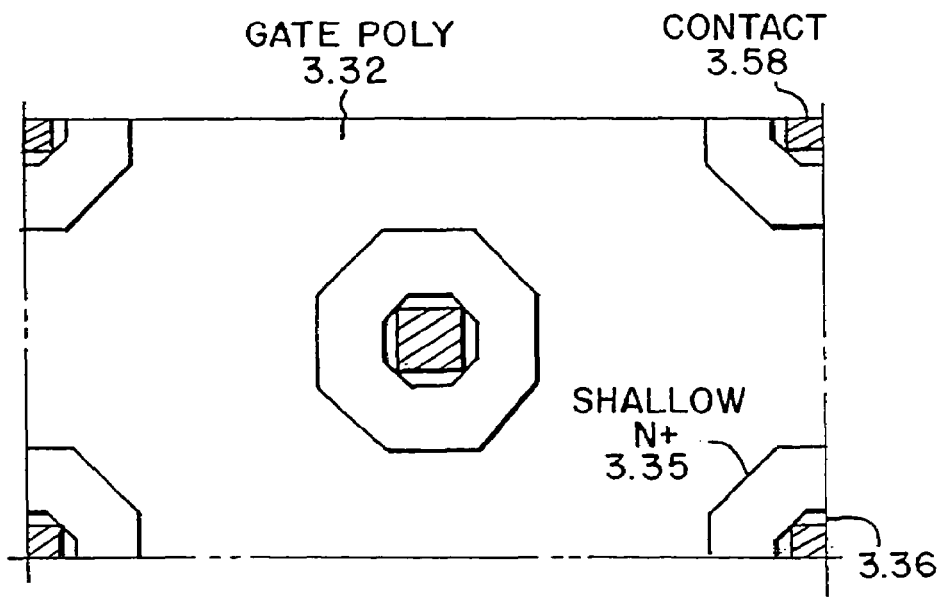

FIG. 3A is a partial plan view of a QVDMOS array;

FIG. 3B is a cross-sectional view of the termination portion of the QVDMOS array;

FIG. 3C is an enlarged cross-sectional view of a source cell of a QVDMOS array;

FIG. 3D is an enlarged plan view of a portion of the source array;

FIG. 3E is a partial cross-sectional view showing the formation of P-wells in CMOS and QVDMOS devices;

FIG. 3F is a cross-sectional view similar to FIG. 3E showing the simultaneous formation of the PMOS slightly doped drain and the DMOS body;

FIG. 3G is a cross-sectional view similar to FIG. 3F showing the simultaneous formation of the QVDMOS sources, NMOS source and drains, and PMOS body tie;

FIG. 3H is a cross-sectional view similar to FIG. 3G showing the simultaneous formation of NMOS body tie, PMOS source and drain, and QVDMOS body tie using a shallow P+ implant.

Buried Layer

Figure 4A:
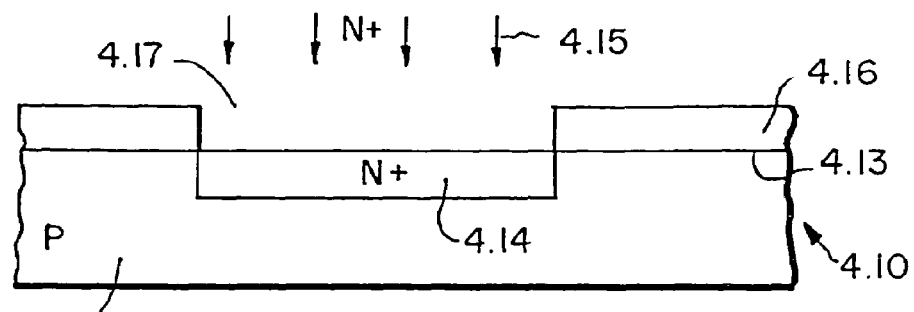
Figure 4B:
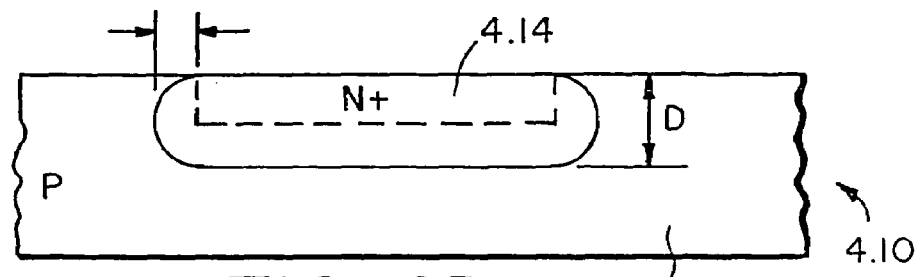
Figure 4C:
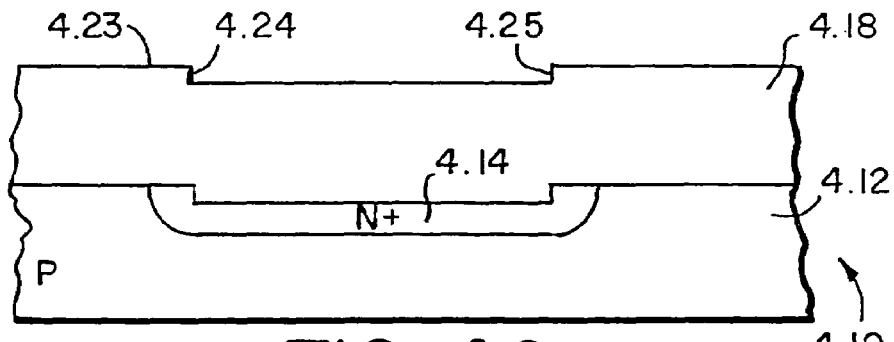
Figure 4D:
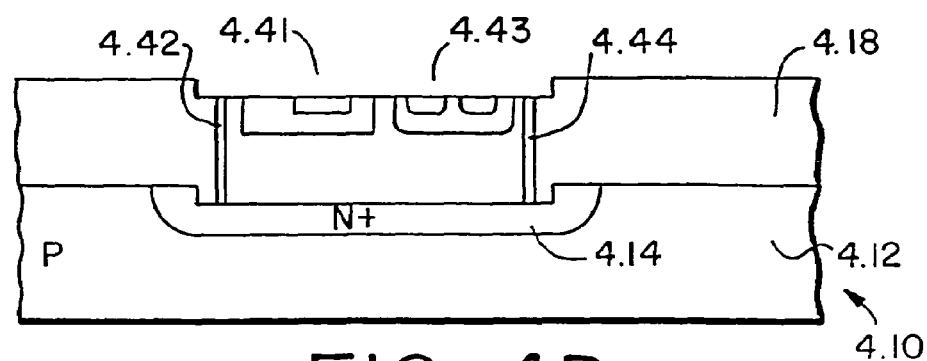

FIG. 4A shows the step of implanting;

FIG. 4B shows the step of annealing;

FIG. 4C shows a step of growing oxide on the substrate;

FIG. 4D shows the substrate with an epitaxial layer containing an integrated circuit including different devices.

Pilot Transistor

Figure 5A:
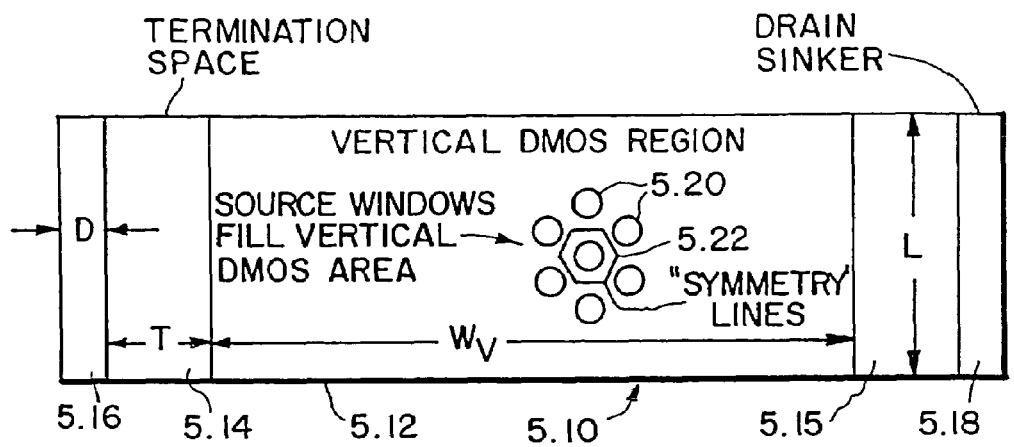
Figure 5B:
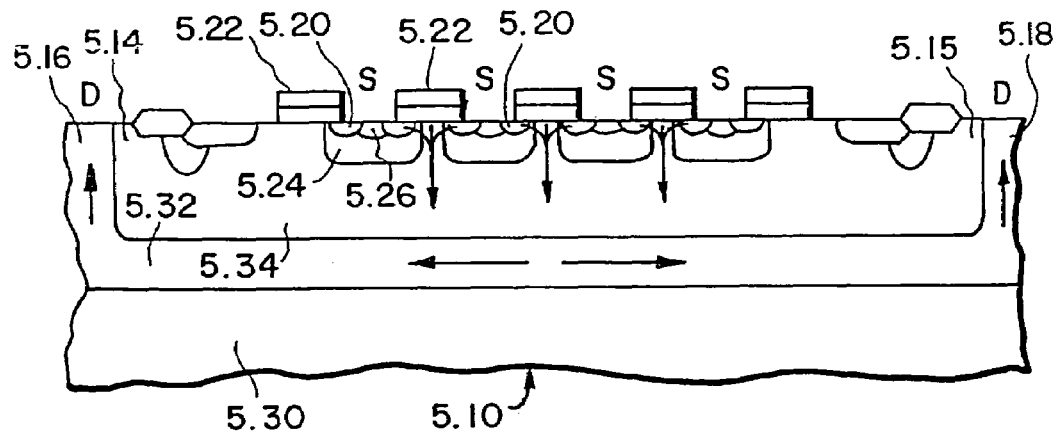
Figure 5C:
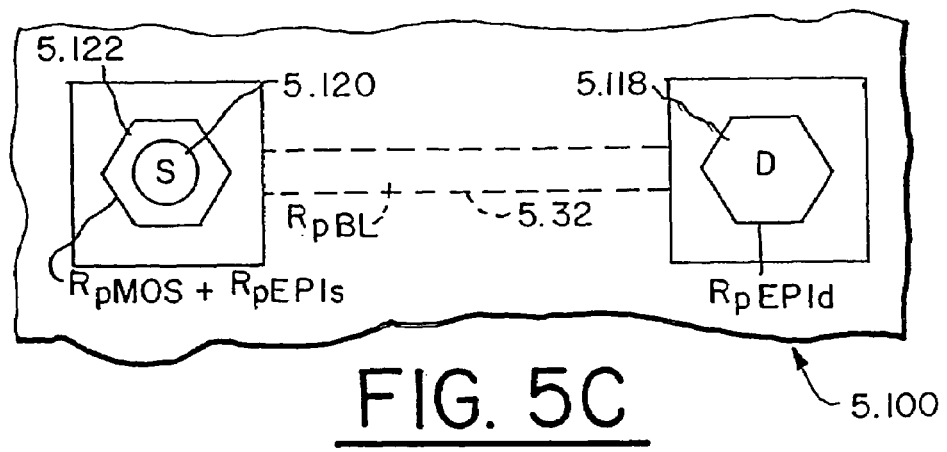
Figure 5D:
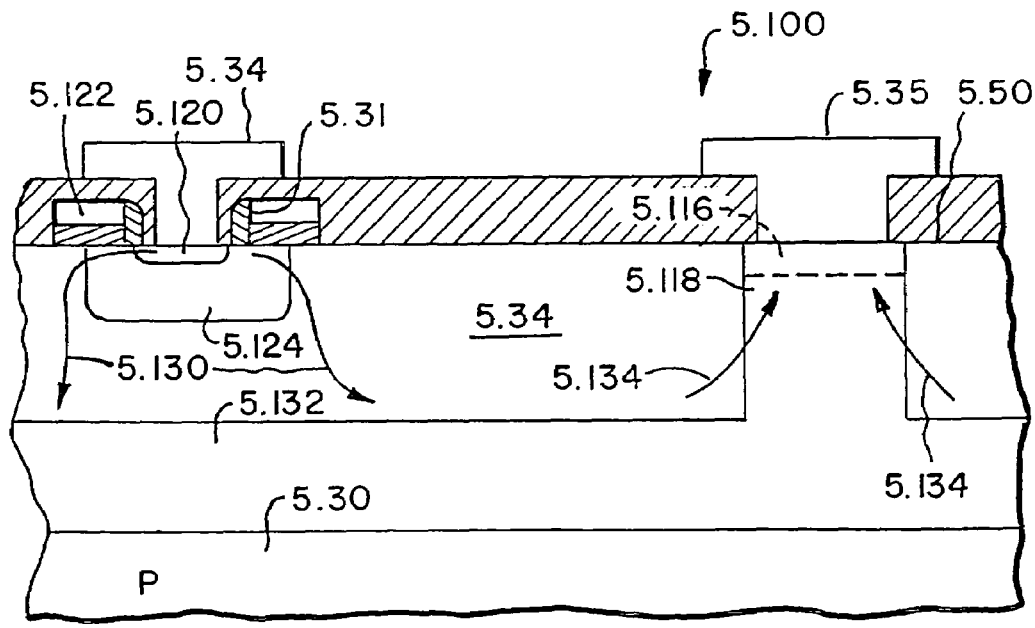

FIG. 5A is a partial planar view of a power DMOS device having an array of source windows;

FIG. 5B is a partial cross-sectional view of the array of FIG. 5A;

FIG. 5C is a planar view of a pilot transistor for the DMOS device of FIG. 5A;

FIG. 5D is a cross-sectional view of the pilot transistor;

DETAILED DESCRIPTION

Switched Audio Amplifier

FIGS. 1F–1I show integrated circuits 1.12.0–1.12.3 in dashed outline. The elements inside the dashed outline represent a flexible combination of elements for an integrated circuit. Further elements could be added to the integrated circuits, including but not limited to the external circuit elements shown outside the dashed lines, such as the resistors, capacitors, diodes, etc. This is simply a matter of design choice and is well known to those skilled in the art of designing integrated circuits.

Figure 1A:
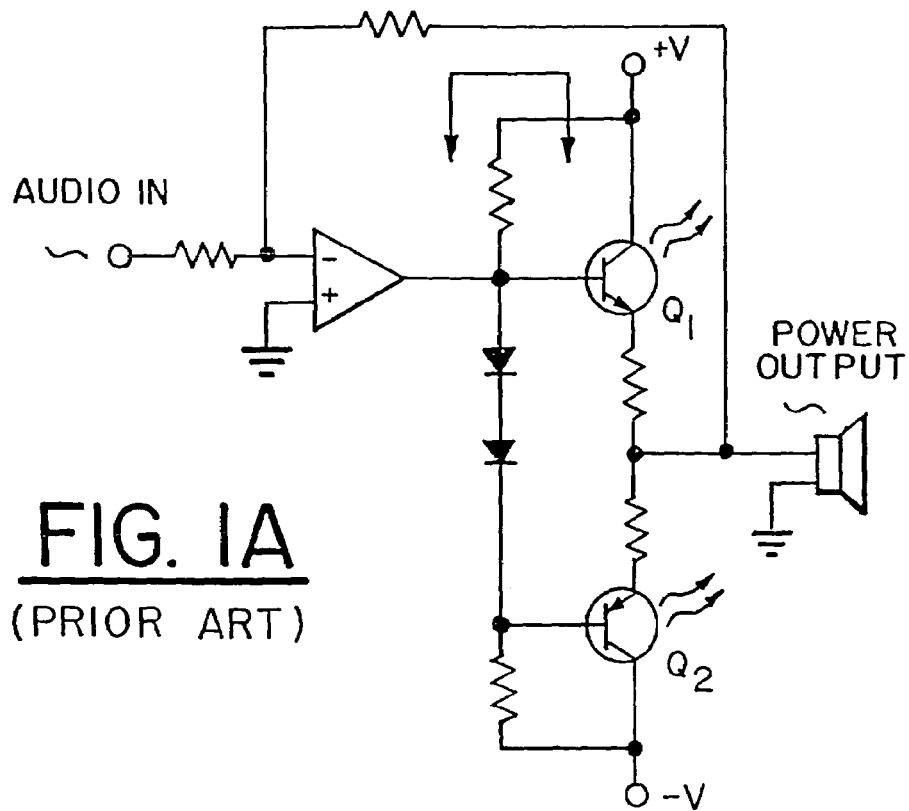
FIG. 1A is a circuit diagram of a prior art push-pull amplifier.
Figure 1B:
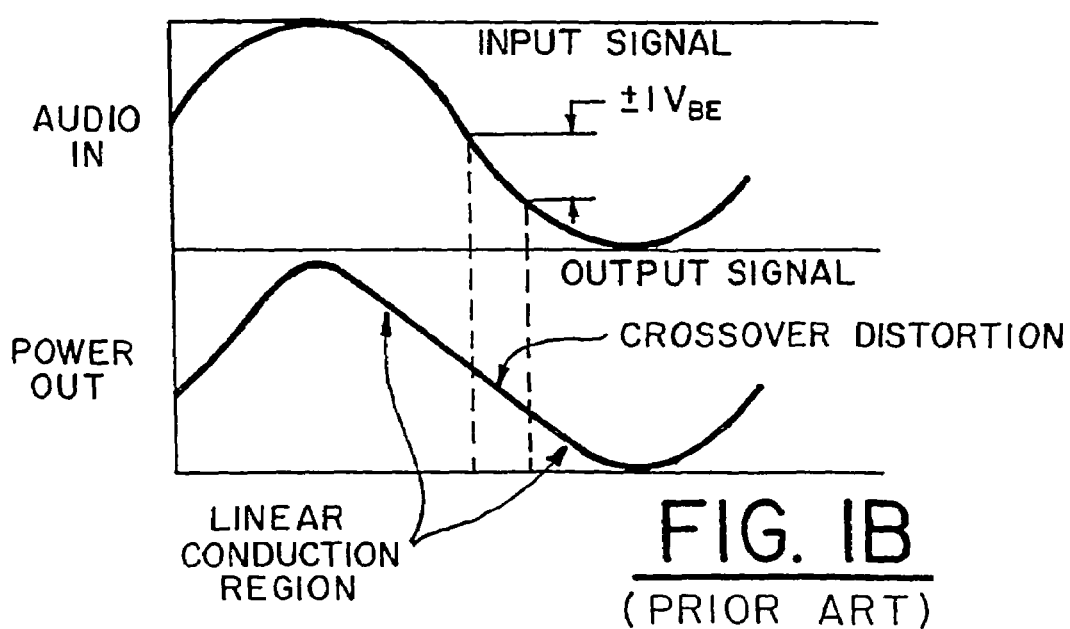
FIG. 1B is a waveform diagram of prior art input and output signals.
Figure 1C:
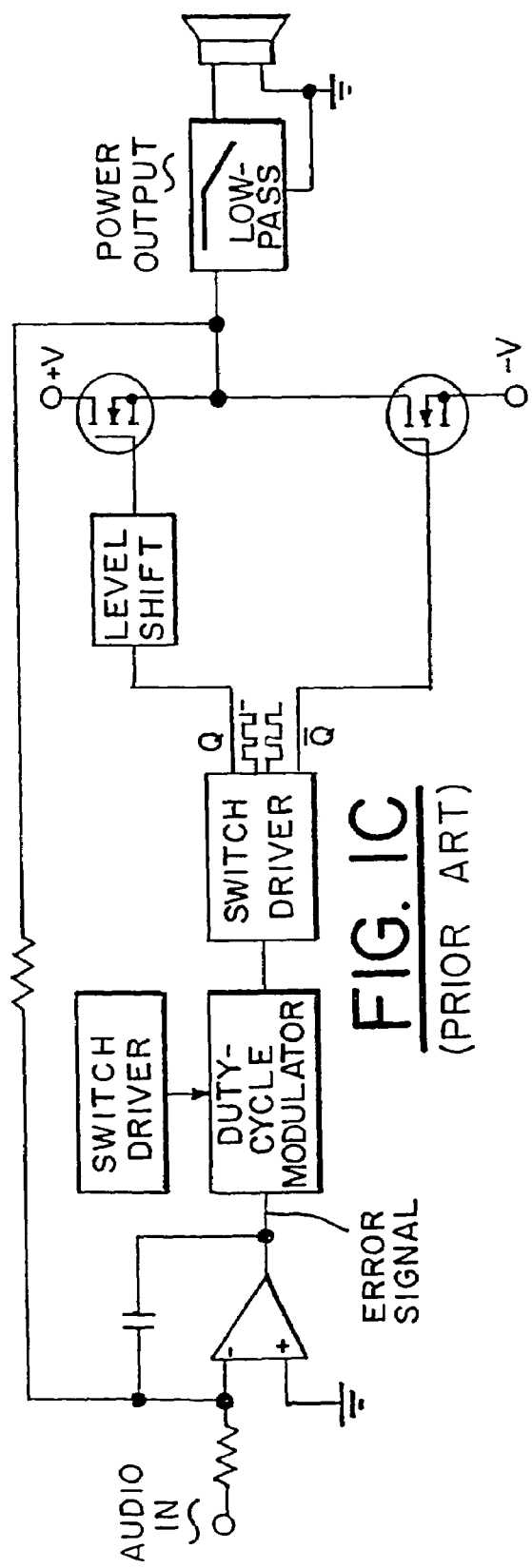
FIG. 1C is a circuit diagram of a prior art class D amplifier.
Figure 1D:
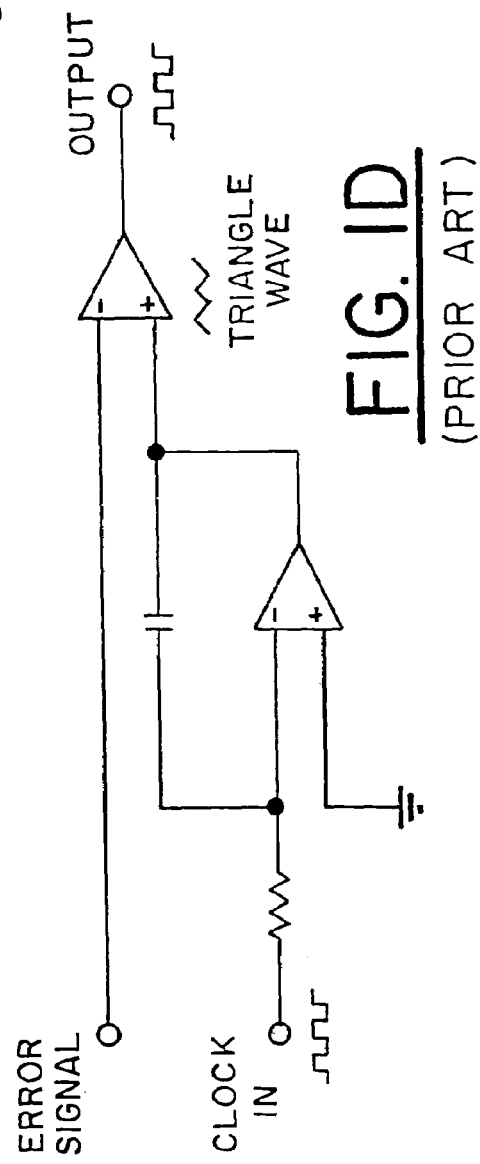
FIG. 1D is a partial circuit diagram of a prior art duty-cycle modulator/comparator.
Figure 1E:
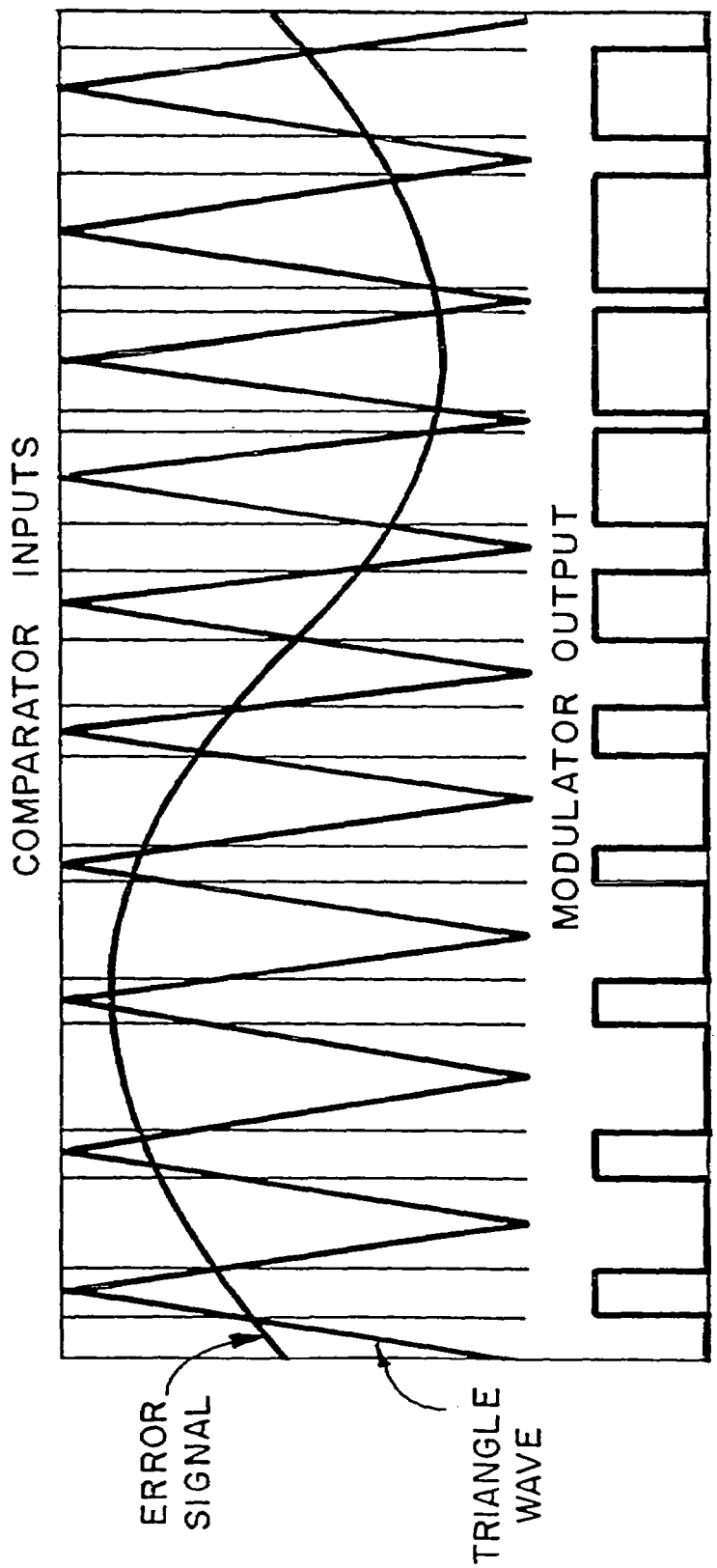
FIG. 1E is a waveform diagram of the input signals and the output signal of a class D amplifier.
Figure 1F:
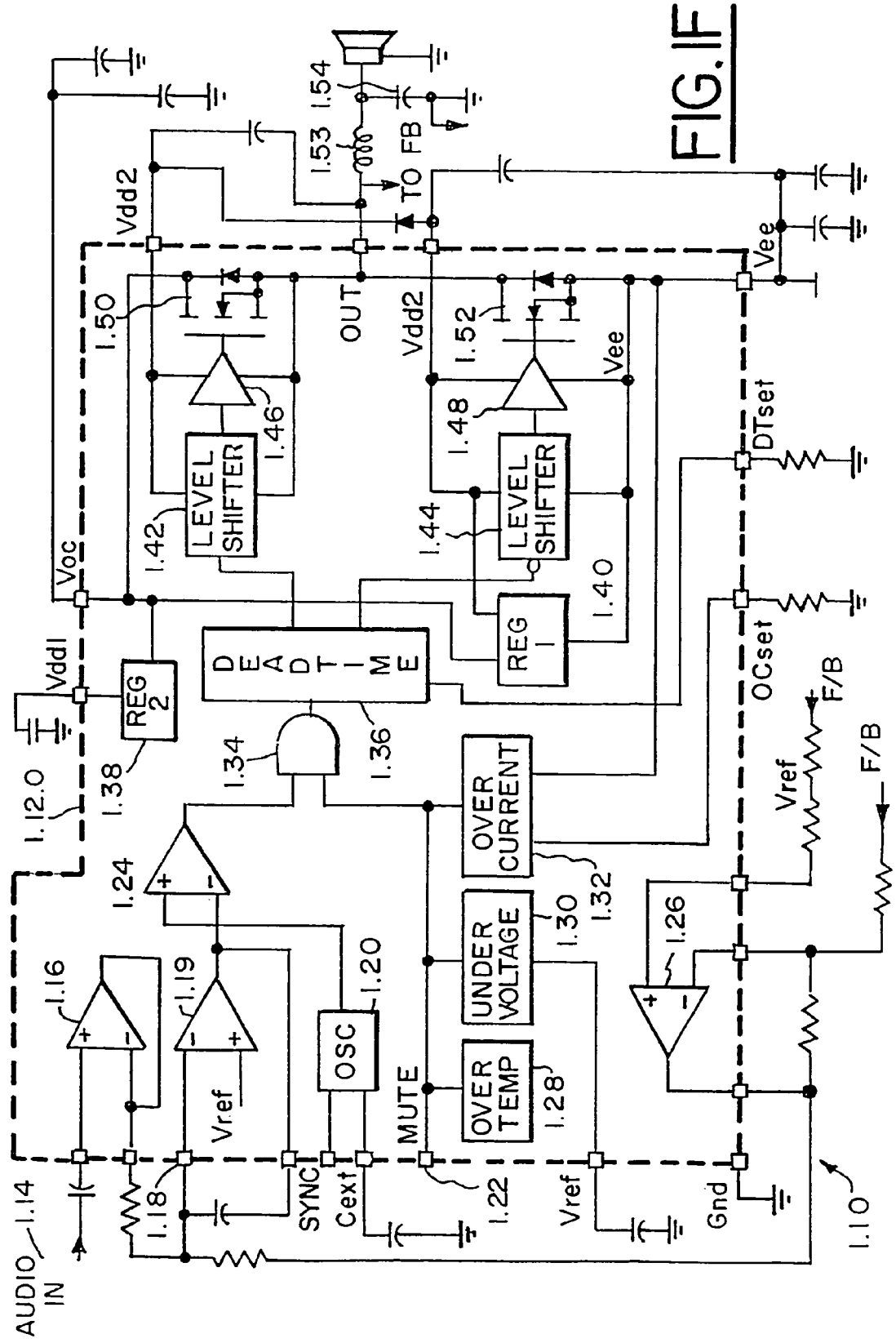
FIG. 1F is a circuit diagram of a monolithic class D amplifier with a bridge driver circuit and a power MOSFET half bridge.

Turning now to FIG. 1F, there is shown an audio system 1.10 that includes a monolithic audio class D amplifier indicated by dash lines 1.12. The amplifier 1.12 has a conditioning circuit including integrator 1.19, triangle wave oscillator 1.20 and the pulse width modulator 1.24. A bridge driver circuit includes control logic circuits for sensing the temperature, low voltage, over current, and deadtime. 1.28, 1.30, 1.32, 1.36, respectively. The bridge driver circuit also includes regulators 1.38, 1.40, level shifters 1.42, 1.44 and gate drivers 1.46, 1.48. The bridge circuit is a half-bridge including power MOSFETs 1.50, 1.52.

The amplifier 1.12 is coupled to a speaker 1.56. Audio input 1.14 is coupled to one input of input buffer 1.16. The output of buffer 1.16 is fed back to one of its inputs and the audio signal is thus inverted in sign and connected to the input 1.18 of integrator 1.19. Audio input 1.14 is received by level shift amplifier 1.16. The output of level shift amplifier 1.16 is tied to its negative input 1.15. The negative input pin of level shift amplifier 1.16 is connected through an external resistor to the input 1.18 of the integrator 1.19. Also connected to integrator 1.19 is a feedback signal from feedback amplifier 1.26. The feedback loop including amplifier 1.26 effectively removes any DC voltage from speaker 1.56.

Triangle oscillator 1.20 supplies one input to the pulse width modulator/comparator 1.24. The other input to pulse width modulator/comparator 1.24 is provided by a triangle wave oscillator 1.19. The oscillator 1.20 is an onchip oscillator and has an outputs for external sync of other oscillators and clock signals. The integrated circuit 1.12 has a mute pin 1.22 which, upon receiving a suitable mute signal, will terminate the output to the speaker 1.56. Feedback amplifier 1.26 receives feedback signals from the output capacitor 1.54 in order to control the integrating amplifier 1.19. The output of pulse width modulators/comparator 1.24 is coupled to AND gate 1.34. Other inputs to AND gate 1.34 include the mute signal or signals from an over temperature control circuit 1.28 and under voltage control circuit 1.30 and an over current control circuit 1.32. The later three circuits are common control circuits found in MOSFET bridge driver circuits. AND gate 1.34 is coupled to dead time logic control circuit 1.36. Deadtime logic control circuit 1.36 ensures that no two transistors on one arm of a bridge are simultaneously on. Power MOSFETs 1.50, 1.52 form a half bridge in the monolithic integrated circuit 1.12. If both transistors 1.50, 1.52 were simultaneously on, the load or speaker 1.56 would be shorted out and the transistors themselves would be connected between the high voltage supply Vdd2 and the low voltage supply VEE. In order to prevent shorting the power MOSFETs 1.50, 1.52 between a high and low voltage supplies, deadtime control logic circuit 1.36 ensures that one of the transistors 1.50, 1.52 does not turn on before the other transistor is off. Deadtime control logic circuit 1.36 is coupled to level shifters 1.42, 1.44. A level shifter 1.42, 1.44 shift the level of voltage from a relatively low level required for the class D amplifier (3–5 volts) to a higher level (approximately 12 volts) required by the gate drivers 1.46, 1.48. Each of the gate drivers 1.46, 1.48 comprise one or more MOS switch transistors made in accordance with the description found hereinafter. The MOS switch transistors are sufficiently rugged to receive a logic level input signal and provide an output gate driving signals sufficient to drive the gates of the power MOSFET transistors 1.50, 1.52.

The monolithic integrated circuit 1.12 has a pair of QVDMOS power MOSFET drive transistors 1.50, 1.52. The gates of the respective drive transistors 50, 52 are driven by the MOS switch gate drivers 1.46, 1.48, respectively. The half bridge consisting of QVDMOS transistors 1.50, 1.52 operates typically in the range of approximately 30 volts and carries approximately one amp for a total power rating of approximately 30 watts. However, those skilled in the art will appreciate that the QVDMOS transistors 1.50, 1.52 can be scaled to handle voltages as high as 60–100 volts and currents as high as 10–20 amps. The output of the QVDMOS transistors 1.50, 1.52 are connected to the speaker 1.56 through a filter that comprises inductor 1.53 and capacitor 1.54. The inductor 1.53 and capacitor 1.54 are a low pass filter which removes the pulse frequency modulation provided by pulse width modulation/comparator 1.24.

The foregoing description of the monolithic audio amplifier includes the class D amplifier conditioning circuit comprising integrator 1.19, oscillator 1.20, and pulse width modulator/comparator 1.24. The bridge driver portion of the circuit typically includes the logic control circuits 1.28, 1.30, 1.32, and 1.36, the level shifters 1.42, 1.44, and the gate drivers 1.46, 1.48. The bridge driver circuit includes power MOSFETs 1.50, 1.52. Under alternate embodiments of this invention, each of the foregoing circuits may be individually integrated. Likewise, the individual circuits may be combined in subcombinations. For example, the class D amplifier conditioning circuit may be combined with the bridge driver in one integrated circuit and the bridge circuit may comprise a separate integrated circuit. Alternatively, the bridge and bridge driver may comprise one integrated circuit in a class D amplifier conditioning circuit may comprise another integrated circuit.

An example of the later is shown in FIG. 1G. There, the audio integrated circuit indicated by dashed outline 1.12.1 receives an input 1.15 from a class D conditioning circuit such as a digital signal processor or an analog pulse width modulated signal. The input signal is received by a first level shifter 1.42 and is coupled to deadtime control circuit 1.46. Also coupled to deadtime control circuit 1.36 are the over temperature control circuit 1.28, under voltage detector circuit 1.30, and over current detector 1.32. Level shifter 1.44 is coupled to deadtime control circuit 1.38. The audio integrated circuit 1.12.1 has gate drivers 1.46, 1.48, which are respectively connected to a half bridge output power QVDMOS transistors 1.50, 1.52. The output of the transistors 1.50, 1.52 are coupled through a filter including inductor 1.53 and capacitor 1.54 to the speaker 1.56.

One of the advantages of audio integrated circuit 1.12.1 is its ability to be connected directly to the speaker 1.56 and thereby provide an active speaker. By placing the bridge driver circuit and the bridge circuit directly on the speaker 15.6, there is no further need to match the power requirements of the speaker 1.56 to the audio system that generates the DSP or PWM signal 1.15. As such, the active speaker 1.56 is independent of the audio signal generating system and will not load down the system with its own power requirements since the power is separately supplied to the speaker 1.56.

Figure 1H:
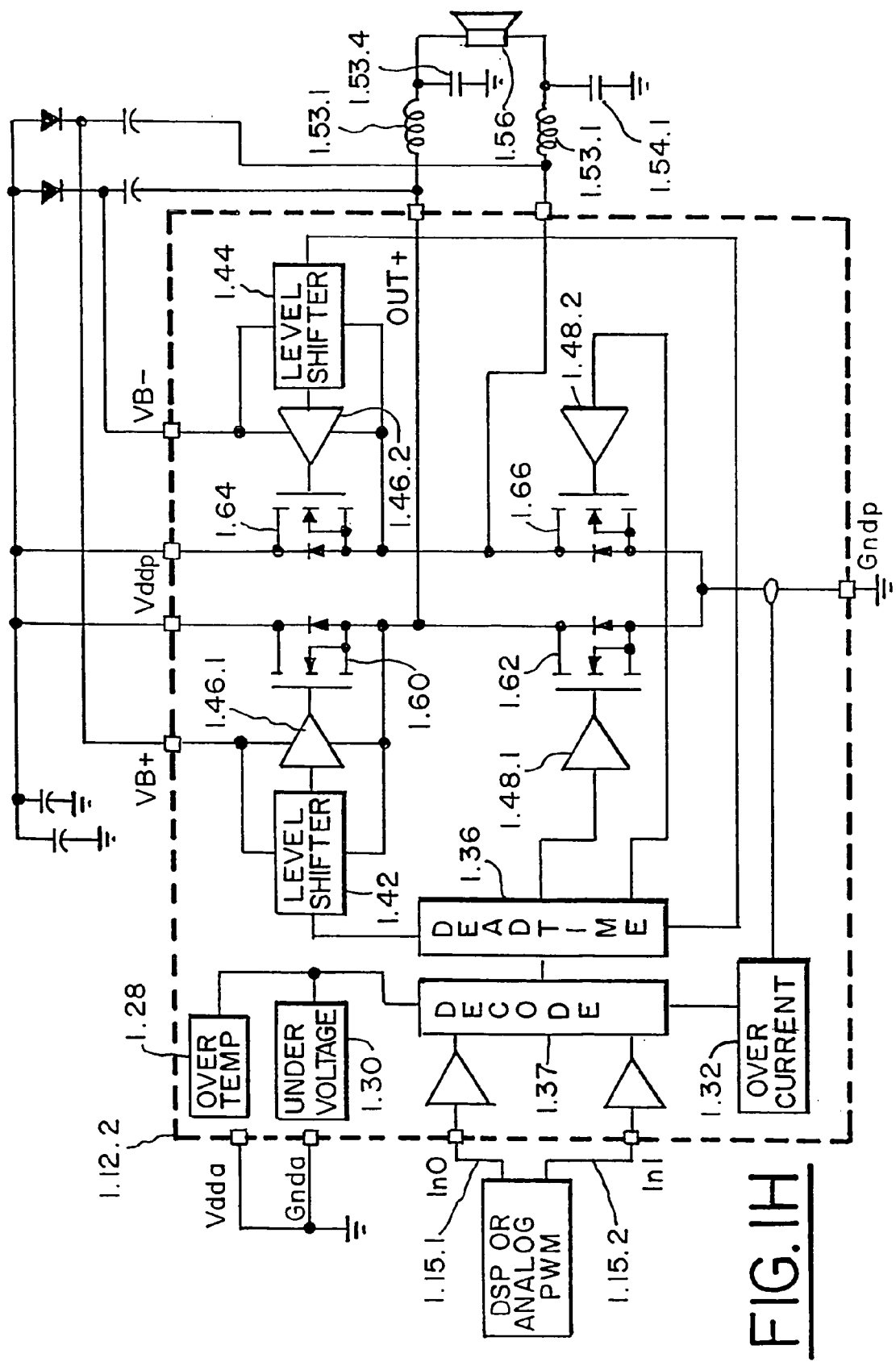
FIG. 1H is a circuit diagram of an audio integrated circuit similar to FIG. 1G and having a full bridge.
Figure 11:
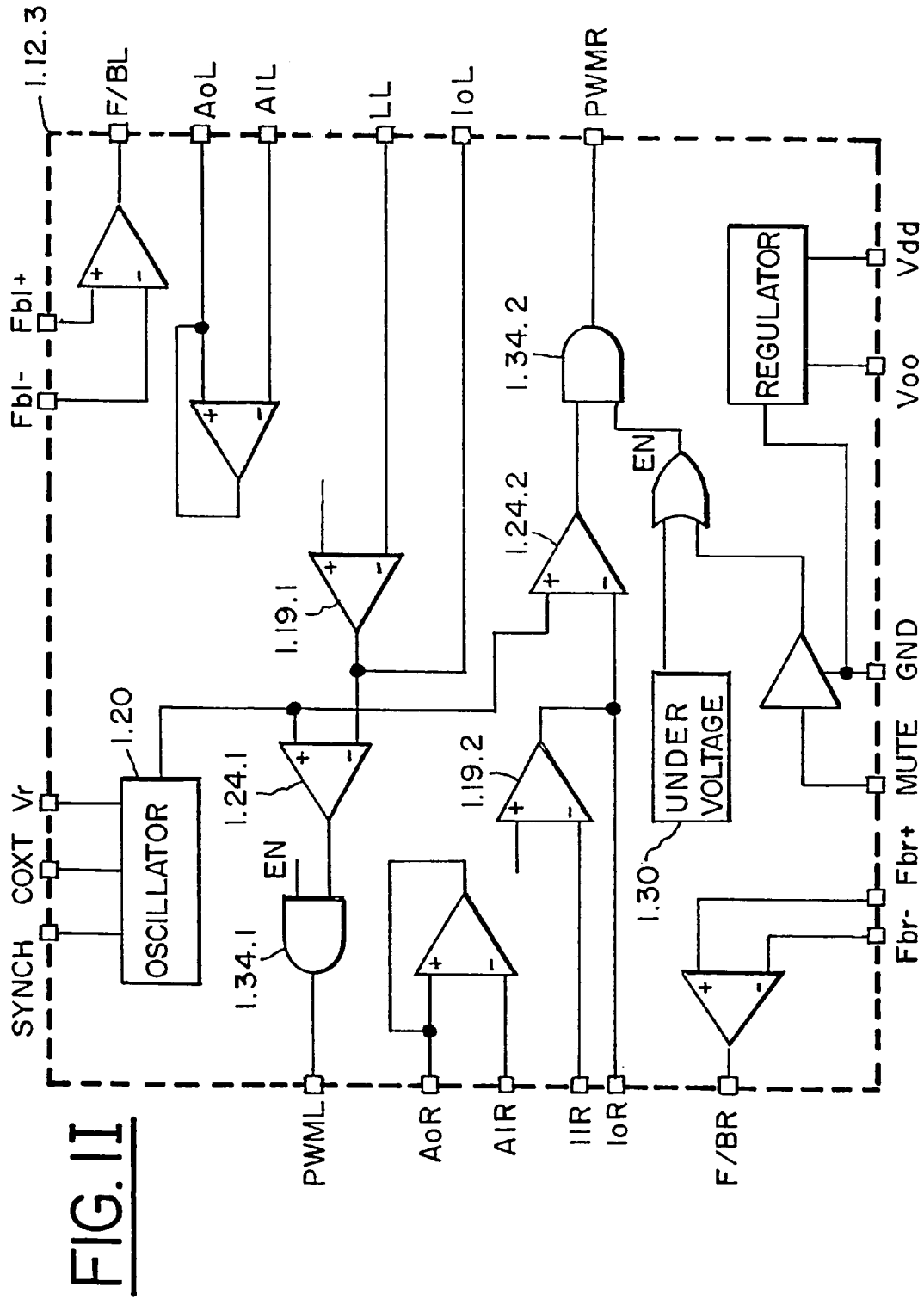

Turning to FIG. 1H there is shown an audio integrated circuit 1.12.2 that is similar to amplifier 1.12.1. Circuit 1.12.2 includes a full bridge power MOSFET section that consists of QVDMOS transistors 1.60, 1.62 on one arm of the bridge and 1.64, 1.66 on the other arm of the bridge. Those skilled in the art understand that a full wave bridge will drive the speaker in two directions. So, the full bridge not only drives the speaker coil in the forward direction as well as the reverse direction. Accordingly, the full bridge can direct current into the load 1.56 in different directions. The full bridge circuit also has level shifter 1.42, 1.44. The full bridge circuit of audio amp 1.12.2 includes four gate drivers. Two gate drivers 1.46.1, 1.48.1 drive one half of the bridge and gate drivers 1.46.2, 1.48.2 drive the other half of the bridge. Likewise, audio amplifier 1.12.2 can be directly coupled to the speaker 1.56 in order to provide an active speaker. Audio amplifier 1.12.2 receives two signals 1.15.1, 15.2 from either a digital signal processor or a class D amplifier conditioning circuit. The respective signals are decoded by decoder 1.37 and are fed into deadtime control logic circuit 1.36. The remaining operation of circuit 1.12.2 is similar in operation to circuits 1.12.0, 1.12.1.

Turning to FIG. 1I, there is shown an example of integrated circuit 1.12.3 that provides a class D amplifier conditioning circuit for both the left channel and right channel of an audio system. Integrated circuit 1.12.3 is an analog front end signal conditioning circuit that generates the switching pulse width modulator control for both the right and left channel in a class D switching audio amplifier system. Circuit 1.12.3 is designed for high efficiency audio amplification. When circuit 1.12.3 is used in conjunction with either a driver output stage or power MOSFET driver devices, and optimum system can be designed for the desired power level.

So, a left channel input signal is received by integrating amplifier 1.19.1; the right channel audio input signal is received by integrating amplifier 1.19.2. The pulse width modulator/comparator amplifier 1.24.1 for the left hand channel receives the output of integrating amplifier 1.19.1 and also receives an input from oscillator 1.20. Likewise, right hand channel pulse width modulator/comparator 1.24.2 receives an input from oscillator 1.20 and the output from right hand integrating amplifier 1.19.2.

Respective enabling gates 1.34.1, 1.34.2 couple the left hand pulse width modulated signal to one output pin and the right hand pulse modulated signal to another output pin. The outputs from the left channel and the right channel may be connected to integrated audio circuits 1.12.1 or 1.12.2 in order to drive the respective right hand and left hand speakers.

Active Speaker

Figure 1J:
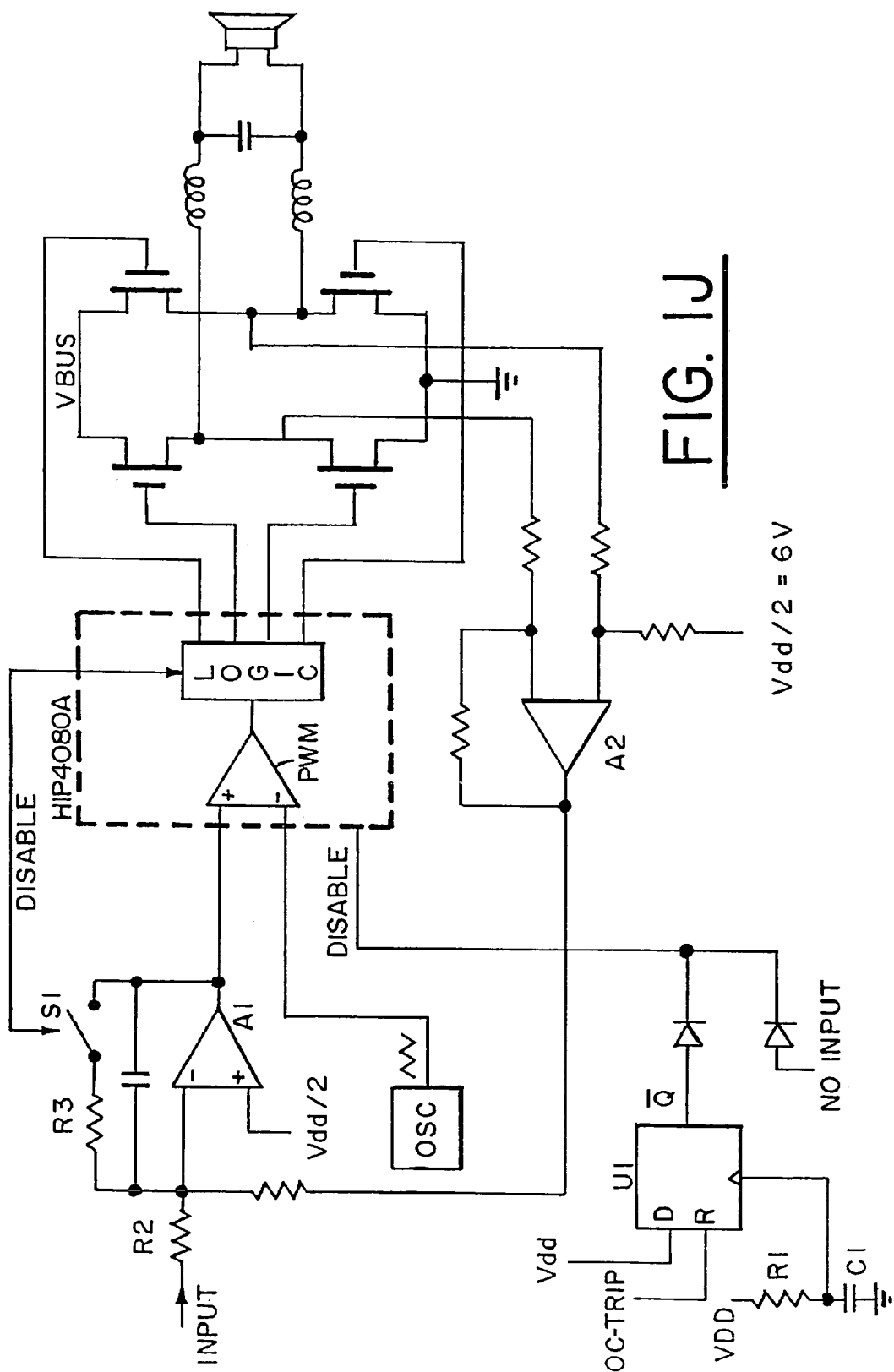
FIG. 1J is a circuit diagram of a first embodiment of a silent start class D amplifier.
Figure 1K:
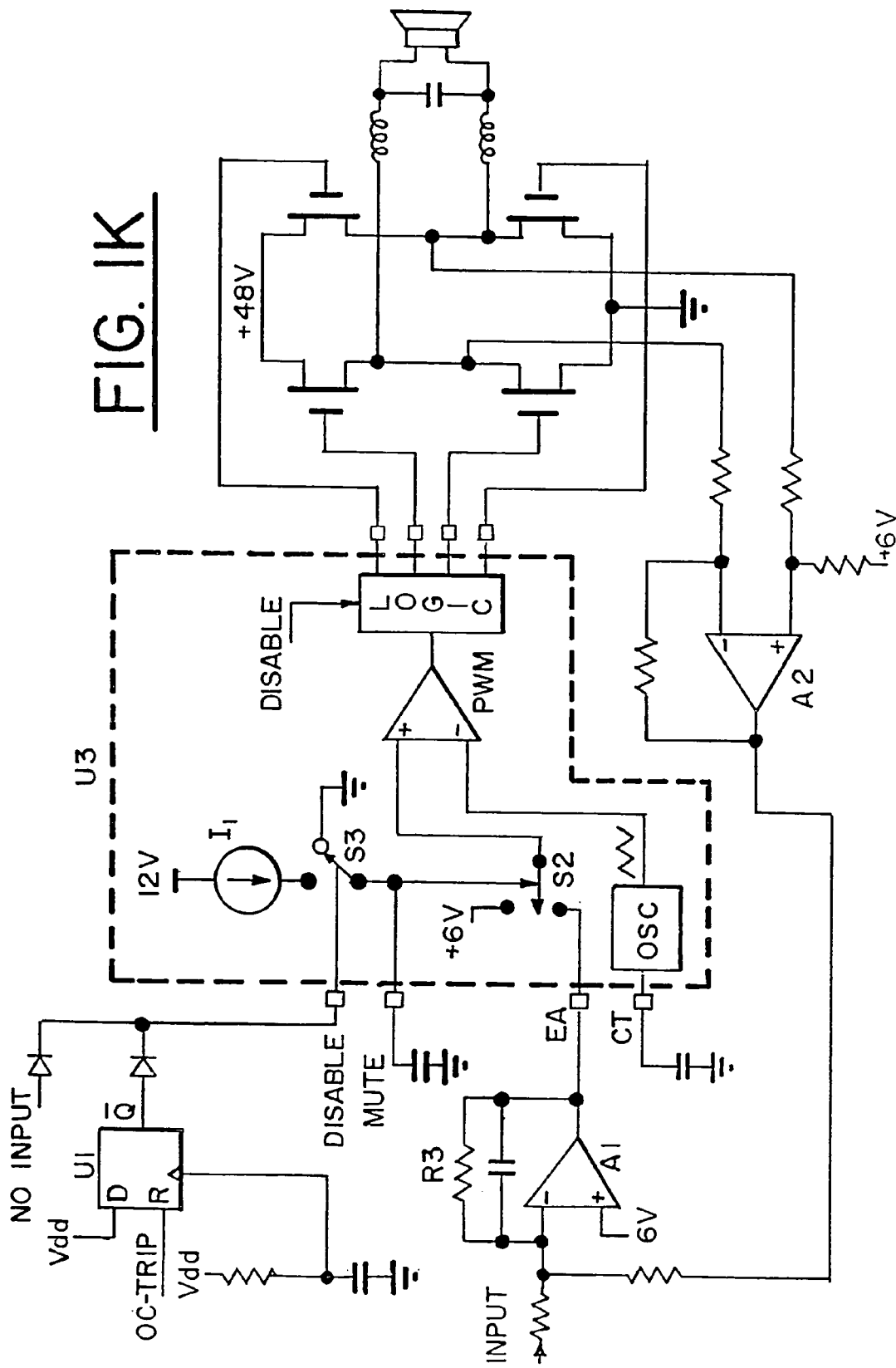
FIG. 1K is a circuit diagram of a second embodiment of a silent start class D amplifier.
Figure 1M:
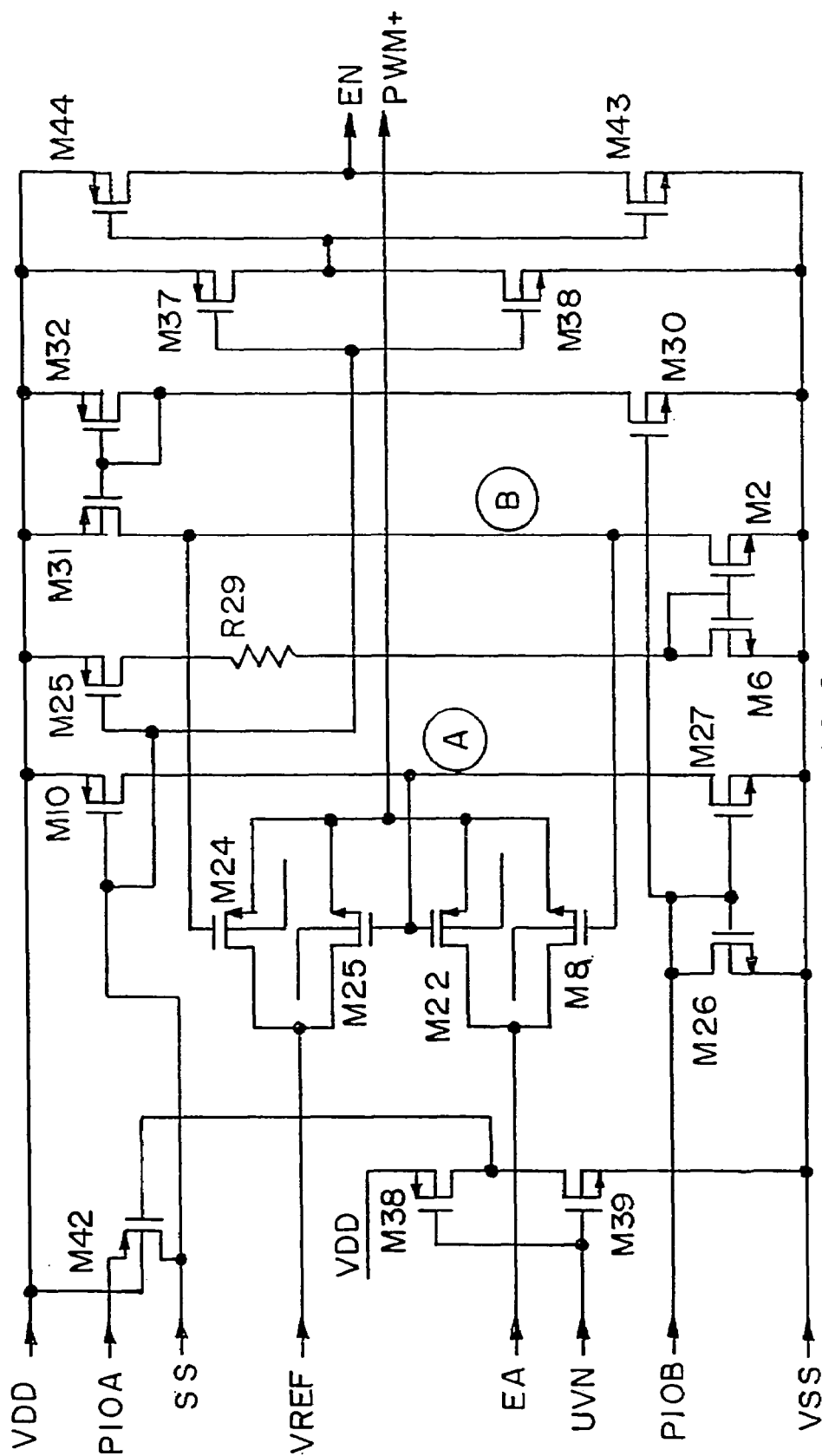
FIG. 1M is a detailed circuit schematic of the circuit shown in FIG. 1K.
Figure 1N:
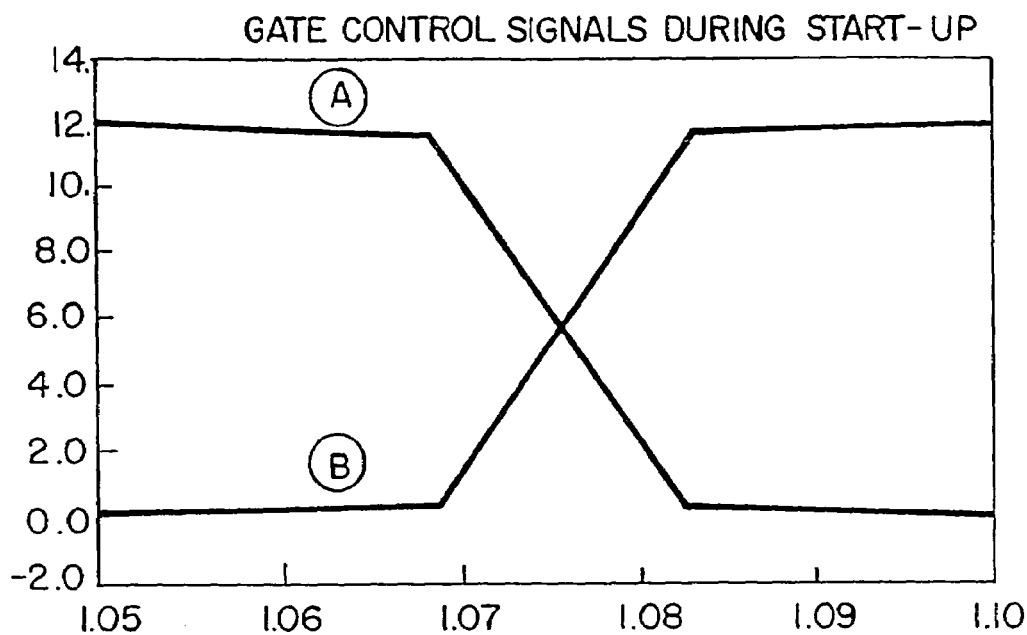
FIG. 1N is wave form diagram showing operating characteristics of the circuit of FIG. 1M.
Figure 1P:
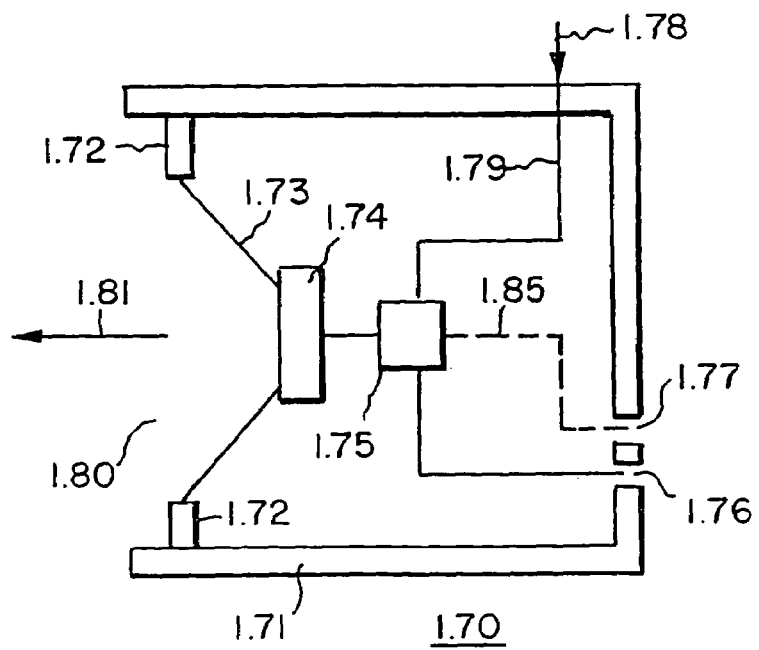
FIG. 1P is a schematic representation of an active speaker.

Turning to FIG. 1P there is shown an active speaker 1.70 having a housing 1.71 with a circular aperture 1.80 in the front wall 1.72. A diaphragm 1.73 is mounted on the front wall 1.72 for generating output sound in the direction indicated by arrow 1.81. The diaphragm 1.73 is driven by a voice coil 1.74 or any other suitable diaphragm driving apparatus. The voice coil receives its power from an integrated circuit 1.75. The integrated circuit 1.75 includes at least a half-bridge or a full bridge of power MOSFET devices for operating the voice coil. The integrated circuit 1.75 may further include a bridge driver circuit. As a further alternative, the integrated circuit may include an entire class D amplifier, such as the one shown above in FIG. 1F.

In one embodiment, power is supplied to the speaker from an external power source via power input jack 1.76. It is envisioned that the power source (not shown) is ordinary 110 volts alternating current. The integrated circuit 1.75 may further include an ac/dc converter for converting household current and voltage to the dc voltage and currents required for proper operation of the integrated circuit 1.75 and the voice coil 1.74. As an alternative, a separate ac/dc converter could be disposed between the integrated circuit 1.75 and the power supply input jack 1.76. Audio information is input to the integrated circuit via a data input connection pin 1.79. Audio information is received data via a wireless antenna 1.78 or via customary speaker wires as shown by dashed line 1.85 from the integrated circuit 1.75 and audio input jack 1.77. The wireless transmission is accomplished at any suitable frequency and infrared frequencies are preferred. The audio information may also be superimposed on the power source and suitable circuitry in the integrated circuit 1.75 or a further filter circuit (not shown) may separate the audio information from the power supply voltage. The imposition of information signals on household power sources is well known in the art.

Audio Amplifier Silent Start

The invention provides for a silent start circuit in a class D amplifier. The class D amplifier has an input amplifier with a first input connected to the audio input signal and a second input connected trough a feedback path to the output of the bridge driver circuit. The input amplifier has a switch that operates a first position to configure the input amplifier as an integrating amplifier and a second position to configure the input amplifier as a summing amplifier that sums the audio input and the feedback signal. The input amplifier has, in effect, two feedback paths between its output and its audio input. One feedback path comprises a summing resistor and the other feedback path comprises an integrating capacitor. The switch selects one of the two feedback paths. The input amplifier switch is connected in series with a summing resistor, said switch being responsive to a disable signal for selectively opening and closing the feedback path through the summing resistor. The class D amplifier with the silent start circuit may further comprise a bridge driver circuit and bridge circuit. The bridge driver circuit includes a plurality of power MOSFET devices for receiving the output power driving pulses from the bridge driver circuit, means for applying the power driver pulses to the gates of the power MOSFETs to generate output power voltage pulses at a power voltage level.

Another embodiment of the invention uses the comparator to provide a silent start. The second embodiment the comparator has first and second inputs, the first input from the integrating amplifier and the second from a reference oscillator voltage signal. The comparator generates an output series of pulse width modulated pulses, each pulse having the amplitude of the reference voltage signal and a width proportional to the amplitude of the sampled audio signal, the series of pulses having a frequency substantially greater than said audio frequency. A switch is coupled to the first comparator input and operable in response to a disable signal to connect the first input of the comparator to a mute reference voltage source to generate a comparator output having a 50% duty cycle that saturates the integrating amplifier. Typically the reference voltage will be half the maximum voltage level of the oscillator voltage signal. In response to an enable signal, the switch gradually connects the output of the integrating amplifier to the first comparator input and gradually unsaturates the integrating amplifier. The switch means includes one or more variable resistors for gradually increasing the resistance between the mute reference source and the first comparator input and for gradually reducing the resistance between the integrator output and the compactor input when the switch means is placed in its enable position. The silent start amplifier switch is coupled to a current in response to the enable signal the switch closes and connects the capacitor is connected to the first comparator input. In response to the disable signal, the switch is open and connects the current source to the capacitor for charging the capacitor to a voltage corresponding to the maximum voltage of the oscillator signal.

EMBODIMENT 1

The first embodiment of the invention is shown in FIG. 1J. Analog switch S1 has been added to the integrator circuit A1. Switch S1 is controlled by the disable signal. When the output bridge is disabled, the S1 switch is closed and A1 becomes a summing amplifier instead of an integrator. Since the bridge is not switching, the voltage across the speaker drops to zero, and the output of A2 goes to +6V. In this configuration A1 is an inverting amplifier with a gain of −R3/R2 times the input. R3 is chosen here so that A1 does not saturate prior to start-up. So, when the amplifier is enabled, the bridge starts switching and switch S1 is opened. The error voltage output of A1 continues to follow the input as it was before S1 was opened, eliminating the start-up thump.

EMBODIMENT 2

The second embodiment of the invention is shown in FIG. 1K and further in FIGS. 1L and 1M. This embodiment relates to audio IC PWM controllers where the integration amplifier A1 is external to the IC.

Referring to FIG. 1K, when the IC U3 is disabled, the switching of the output stops. S3 connects the mute signal to ground which controls switch S2 so that the + input to the PWM comparator is connected to +6V. When the disable signal is removed, switch S3 allows a current source to charge a capacitor on the mute node and cause a slowly moving control voltage at switch S2. While the control voltage is low, the output begins to switch since the part is enabled. The PWM comparator commands a 50% square wave regardless of the error signal because the + input to the comparator is at +6V, the midpoint of the triangle wave on the − input of the comparator. The 50% duty cycle output of the H-Bridge is filtered to result in zero voltage across the load. As the control voltage rises, the + input to the comparator is switched from the +6V reference to the input. There is a transition period where the + input to the PWM comparator is connected to both the E/A input and the +6V through variable resistors. The switch transition from +6V to E/A is accomplished by slowly increasing the resistance between PMW+ and −6V while decreasing the resistance between PMW+ and E/A. The switch transition is intentionally made to overlap to allow a gradual transition between a 50% duty cycle output and the normal operating condition. This allows tile integrator to come out of saturation while the bridge output is still predominately controlled by the +6V reference and eliminates the start-up transient.

A simulation of the start-up procedure is shown in FIGS. 1L(i)–1L(iv). The top graph of FIG. 1L(i) is labeled the soft start voltage and represents the slowly rising control voltage on the mute pin. Graph 1L(iii) shows the output of the integrator A1 of FIG. 1K saturated to the negative supply rail, 0V. Graph 1L(iv) shows the input signal. As the soft start voltage rises, the integrator recovers from saturation to follow the input. The sharp positive spike shown in FIG. 1L(iii) is a simulation anomaly and is not present in FIG. 1L(ii). FIG. 1L(ii) represents the + comparator terminal. FIG. 1L(ii) shows a smooth transition between the +6V reference and the input signal on the + input terminal of the comparator.

In operation, when the disable signal is high, the output is disabled, switch S3 is connected to ground the + input to the PWM comparator is connected to +6V. The triangle wave varies between +4 and +8V, so the PWM has a 50% duty cycle. When the disable signal is removed, switch S3 connects to a current source $I_1$ through an external capacitor on the mute pin. The current source $I_1$ gradually charge the capacitor on the mute pin to +12V. Simultaneously, switch S2 gradually connects the + input of the PWM comparator to the output of the integrator A1 and disconnects the + input from +6V. That gradual connection is accomplished by variable resistors (not shown) which gradually increase the resistance between the +6v source and the + input and decrease the resistance between the A1 output and the + input to the PWM comparator. This allows A1 to gradually come out of saturation and follow the audio input having an ac signal riding on a +6 volt dc level.

FIG. 1M shows a detailed schematic of one implementation of switch S2 from FIG. 1K. The circuit consists of two transmission gates, the on/off control gate to the mute pin current source, and additional current mirrors used to control the transmission gates. The pin labeled UVN will be connected to the chip level disable signal and SS is connected to the external mute pin. When disable is high/UVN is low, the current source gated by M42 is turned off and the SS/mute pin is pulled to VSS by an external means. With SS/mute at VSS M0 will overcome the 10 uA current mirrored into M27 and pull gate control line A high. M28 will also be on hard with its current limited by resistor R29. This current will be mirrored by M6 into M2 and pull gate control line B low. With the gate control lines in this state, A=hi, B=lo, M8 and M22 are off and M23 and M33 are on. This connects the VREF input to the PWM+ output. VREF would be connected to +6V and PWM+ would be connected to the + input of the PWM comparator as described above. When the chip is enabled, UVN will go high and allow the current source on P10A to charge the SS/mute pin. As the SS/mute pin gets within a PMOS threshold of VDD, M0 and M28 begin to turn off. The fixed current sources M27 and M32 slew the voltages on the gate control lines as SS/mute continues charging up to VDD. Gate control voltages A and B are shown in FIG. 1N. As steady state with SS=VDD, A=lo, B=hi, M8 and M22 are on the M23 and M33 are off. This connects the E/A input representing the error amp or integrator output to the PWM+ pin which is connected to the + input of the PWM comparator at the integrated circuit top level.

MOS Switch

Power MOS switches are often constructed as large arrays of a standard linear gate MOS transistor configuration. FIG. 2A schematically depicts a single transistor 2.10 comprising a drain region 2.101 and a source region 2.102 separated by a gate region 2.103 having a contact 2.104. Both the drain and source regions are provided with contacts 2.105.

Also shown in FIG. 2A is an array 2.20 of linear gate MOS transistors. In this approach to switch design, the effective width W of the transistor is scaled up to give the conduction required. The specific channel width (W/total device area) is then set by the minimum drain-to-source pitch that can be achieved by the process. Typically this is limited by the gate length L, the contact size, and the necessary spacing of contact to gate polysilicon. In such an array the metal routing, represented by the bold arrows 2.105 in FIG. 2A, to the source and drain is typically parallel to the gate polysilicon. This allows contact spacing to be very tight, thereby contributing negligible source or drain distribution resistance to the device. For an optimum device of this linear design, the metal routing pitch equals the source-drain pitch; this is important, given the great impact of the metal routing configuration on the achievable conductance and yield of a large area MOS switch.

One frequently employed improvement on the standard linear gate layout of a power MOS transistor is a "checker board" arrangement 2.30, shown schematically in FIG. 2B, in which the drain and source regions, and their contacts 2.201 and 2.202, respectively, alternate with one another in both the rows and columns of the array. Again, the source and drain regions are separated by gate region 2.203. Depending upon the relative values of channel length, contact size, and contact to polysilicon spacing, this approach may be effective at increasing the specific channel width of the layout. In this configuration, the metal routing required is along the diagonals, represented by the series of arrows 2.204, connecting the drain windows and the source windows. Assuming the same dimensional constraints as for the linear gate array of FIG. 2A, the metal routing pitch is 0.707 (inverse of square root of 2) times the source-drain pitch. Thus, although the specific channel width may be improved by the "checker board" pattern, the metal routing constraints would be aggravated.

In some cases the "checker board" layout of FIG. 2B is complicated by differing spacing requirements for drain-polysilicon and source-polysilicon contacts. This is usually the case for extended drain transistor designs, where the "checker board" square dimension is set by the larger spacing of the drain, resulting in wasted area in the oversized source windows. This situation may completely negate the gains anticipated from the "checker board" pattern.

The power MOS switch 2.40 of the present invention, whose configuration is depicted in FIG. 2C, is characterized by substantially increased specific channel width compared with the arrangements of the prior art. In accordance with the invention, the size of the areas enclosed by gate polysilicon around each drain or source contact is determined by the contact to polysilicon spacing, even in the case of unequal source and drain size requirements. The shape of the cells in the drain column, as shown in FIG. 2C, is essentially square; however process factors such as metal pitch requirements may require rectangular designs. The drain regions 2.300 in one column, each including a contact 2.301, are closely spaced to those in adjacent columns, each column being separated from the adjacent one by a narrow elongated source distribution region 2.302. Also within a column, the drain regions are closely spaced, being separated from one another at least partially by transverse branches of the elongated source distribution regions 2.302. Each drain region is separated from the adjacent source distribution region by ring-shaped gate region 2.303. Provision is made for source contacts 2.304 in those areas of the elongated source distribution regions where they intersect the transverse branches. This configuration serves to minimize cell area while maximizing specific channel width and also simplifies the metal routing arrangement, represented by the arrows 2.305.

The source distribution regions place a significant resistance component in series with the channel conductance, the result of the distributed resistance of the source region between the contact and the active gate edge. It is therefore desirable to keep this source resistance as low as possible relative to the channel conductance. This objective may be achieved by employing a self-aligned silicide layer for the gate, drain, and source regions. The silicide is formed preferably from the reaction of silicon with platinum; however metals such as titanium, cobalt, and tungsten may also be used.

In accordance with the invention, the source distribution regions of the switch may be totally interconnected. However this would leave the gate polysilicon encompassing each drain area isolated and would require individual contacting of each gate ring 2.303. To enable remote contacting of the gate rings 2.303, small connecting polysilicon bridges 2.306 between the rings, as depicted in FIG. 2C, are provided.

The switch configuration provides substantial benefits. The metal routing pitch allowed by this layout is larger than the "checker board" arrangement for the same dimensional constraints. In addition, all the drain regions are almost fully bounded by an active gate so that there is no gate width termination region. Thus, the switch configuration of the present invention provides increased specific channel width (W/area), wider metal routing channels, and reentrant drain design, which may result in substantial yield advantages.

The invention has been described in detail with particular reference to preferred embodiments thereof, but it will be understood that variations and modifications can be effected within the spirit and scope of the invention.

The QVDMOS Transistor

Turning to FIG. 3A, there is shown a portion of a QVDMOS array 3.10. The QVDMOS array 3.10 is a portion of an integrated circuit, not shown, that also includes NMOS devices, PMOS devices and bipolar devices. The array 3.10 has a plurality of octagonal shaped source cells 3.30 that are identical to one another. A metal gate feed 3.12 runs down the center of the array 3.10 and contacts gate 3.24 comprising a gate metal 3.29 on a thin gate oxide 3.32. Beneath the gate feed 3.12 are extended sources 3.39 having a dogbone-like shape. The sources 3.39 located beneath the gate feed 3.12 are elongated so as to maintain the overall symmetry between sources 3.30 and the gate 3.29. On both ends of the array 3.10 there are drains 3.20. The drains 3.20 are separated from the sources 3.30 by drain termination regions 3.16. A gate 3.29 is disposed between adjacent sources. Gate 3.29 is controlled by a voltage applied to the gate feed 3.12. The gate feed 3.12 has contact points 3.28 disposed along its length for receiving a control voltage signal.

With reference to FIG. 3B, there is shown a typical source 3.30 adjacent a termination region 3.16. The source cell 3.30 is fabricated on a lightly doped P-type substrate 3.11. A heavily doped N+ buried layer 3.26 is formed in the surface of the substrate 3.11 in a manner well known in the art. In addition, the N+ buried layer may be formed in the particular manner described in co-pending application Ser. No. 08/472,859 filed Jun. 7, 1995 assigned to Harris Corporation. A heavily doped N+ sinker diffusion 3.14 provides a surface drain contact to the buried layer 3.26. The N+ sinker diffusion 3.14 is formed in a lightly doped N epitaxial layer 3.13 that is grown on the P-type substrate 3.11 in a manner well known in the art or as described in the co-pending application identified above. In the N epitaxial layer 3.13 there is formed a lightly P doped DMOS body region 3.34. A drain termination region 3.16, also lightly P doped, is formed at the same time as the DMOS body diffusion 3.34. Within the DMOS body 3.34 there is a shallow, heavily doped N-type source region 3.35. The N-type source region 3.35 has either a circular or hexagonal annular shape. As better shown in FIG. 3C, within the annular region 3.35 there is a further heavily doped P-type body tie region 3.36 that extends beneath the N-type source region 3.35.

A gate oxide 3.32 surrounds the surface of the annular source region 3.35. Covering the gate oxide is a gate metal layer 3.29 comprising a heavily doped layer of polysilicon. An isolating oxide layer 3.23 separates the source 3.30 from the drain 3.20. Further isolation is provided by drain termination elements including a lightly doped P-type region 3.27 that is disposed between the gate 3.29 and a LOCOS oxide region 3.25. On top of the LOCOS oxide 3.25 is a field plate 3.24. A drain metal layer 3.21 contacts the N+ drain sinker diffusion 3.14. A source metal layer 3.31 contacts the body tie 3.36 and the source region 3.35 of the source cell 3.30.

With reference to FIG. 3C, further features of the source cell 3.30 are shown. There, it will be seen that the gate 3.29 has sidewall oxide spacers 3.40. Also, the surface of the source 3.30 between the oxide spacers 3.40 is silicide with a layer of silicide 3.42. It is optional that the gate polysilicon 3.32 also have a layer 3.43 of silicide.

With reference to FIG. 3D, there is shown how the gate polysilicon 3.32 surrounds the shallow N+ source region 3.35. The body tie region 3.36 is shown enclosed by the surface of the shallow N+ region 3.35. The source metal 3.31 makes contact to the silicide layer 3.42 (not shown) via the contact window 3.58 made in the dielectric layer 3.23.

In operation, when a positive voltage is applied to the gate, current will flow from the drain to the source. The current flow path is shown in FIG. 3B. The current travels from the drain metal 3.21 through the sinker diffusion 3.14, the buried layer 3.26 and then through the epi layer 3.13 underneath the gate oxide 3.32 into the source region 3.35 through the silicide 3.42 and the source metal 3.31. The transit of current through the N epi layer 3.13 is known as the drift region 3.18. As such, when the QVDMOS device is on, its resistance is made up of the combined resistivities of the sinker 3.14, the buried layer 3.26, the N epi layer 3.13, the body region 3.34 and the source region 3.35.

One of the features of the invention is the suicide 3.42 on the source 3.35 and body tie 3.36 region. The use of a silicide on the body tie 3.36 and source 3.35 increases the efficiency of the QVDMOS array 3.10. With the silicide 3.42, it is no longer necessary to open a contact window the same size as the annular source region 3.35 as shown in FIG.

3D. As such, the contact window 3.58 may be substantially smaller than the source region 3.35. The use of silicide 3.42 in contacting the body tie region effectively uncouples the placement of the body tie 3.36 from the location of the source metal 3.31. In prior art devices body tie contacts were made relatively large with respect to the body ties in order to provide sufficient area to insure positive metal contact to both the source and the body tie. Large contacts required larger source cell sizes, thereby reducing the overall efficiency of the source array 3.10. In other words, larger areas were needed to provide for suitable contacting of the body tie and source regions and these excess areas consumed valuable space on the integrated circuit without enhancing the performance of the device. However, by using silicide 3.42 to contact both the source 3.35 and the body tie 3.36, the body tie 3.36 may be efficiently placed in the center of the source region 3.35 and have a relatively small size.

By using the silicide layer 3.42, the source metal contact 3.31 does not have to contact the shallow N+ layer 3.35 that constitutes the QVDMOS source. Instead, the source metal contacts the silicide conductive layer 3.42 which in turn connects laterally to the shallow N+ layer 3.35. As a result, the QVDMOS source 3.30 may use a small contact opening for allowing metal 3.31 to contact the source. The only requirement of the contact is that it fall somewhere within the source window. Without the silicide layer 3.42, the source metal 3.31 would have to explicitly connect with both the shallow N+ layer 3.35 as well as the shallow P region 3.36 with sufficient area contact in order to keep contact resistance low. If silicide was not used, both of the regions 3.35 and 3.36 would have to be significantly larger.

With the silicide layer 3.42, the dimension of the shallow N+ layer 3.35 from the edge of the gate poly 3.29 to the opening in the center is minimized. This is quite important in reducing parasitic bipolar action in the source such as breakdown, snapback and dV/dt triggering. The sidewall spacer oxide 3.40 prevents the silicide from forming a short over the gate poly 3.29.

Another feature of the QVDMOS source cell is the self-alignment of the source region 3.35 and the body tie 3.36. The gate metal 3.29 and gate oxide 3.32 are placed on the surface 3.15 of the epitaxial layer 3.13. Then a light P-type diffusion or implant is made to form body region 3.34 in the epitaxial layer 3.13 in order to define the body 3.34 of the QVDMOS source cell 3.30. Next, the opening between the ends of the gate are masked with a body tie mask and the exposed region is implanted with a shallow N-type doping in order to form the source region 3.35. The source region 3.35 is then driven in and diffused to extend slightly underneath the gate oxide 3.32. Next, sidewall spacers 3.40 are formed by either oxide deposition or thermal oxide growth of the edges of the gate polysilicon 3.29. Sidewall spacers 3.40 offset a subsequent shallow P-type implant from the edges of the source diffusion 3.35. A shallow P-type implant is made into the source opening. In the region 3.35, the P-type ions are neutralized by the N+ ions. In the remaining area, a shallow P+ diffusion 3.36 is formed in the middle of the source 3.35. The P+ type diffusion 3.36 extends beneath the source 3.35 but not beyond the outer edges of the region 3.35.

All MOS transistors, both lateral and vertical, require a body tie to suppress parasitic NPN bipolar action from the source to the drain during breakdown or high dV/dt transitions. If the parasitic bipolar action is initiated, a QVDMOS device can switch to an unwanted conducting state and may be destroyed or may destroy the load. In the invention, the shallow P+ region 3.36 body tie also provides the body tie in NMOS devices and the source and drain for PMOS devices in a corresponding simultaneous formation of CMOS devices. Accordingly, the shallow P+ implant 3.32 is below the shallow N+ implant 3.35. As a result, the QVDMOS body resistance under the shallow N+ implant 3.35 is reduced from about 1,000 ohm/sq. without the shallow P+ implant 3.36 to between 320 and 200 ohm/sq. with the shallow P+ implant 3.36.

In addition, the shallow P+ implant serves to set the QVDMOS breakdown voltage by setting a more abrupt vertical doping profile than the diffused DMOS body 3.34. The sidewall spacers 3.40 extend about 300 nanometers from the polysilicon gate 3.29. The spacers shield the edges of the polysilicon material 3.29 during a subsequent silicide operation. The spacers 3.40 effectively displace the shallow P+ lateral profile 300 nanometer inside the outer edge of the shallow N+ diffusion 3.35, while the vertical profiles are referenced to the same surface. Since the vertical profiles set the breakdown, and the shallow P+ region 3.36 is constrained from the outer edges of the annular source diffusion 3.35, then the point of breakdown will be kept away from the gate oxide 3.33.

The shallow P+ body tie 3.36 also helps prevent snapback. The P+ layer 3.36 underneath the shallow N+ region 3.35 acts like a high quality junction. In effect, the shallow P+ region 3.36 reduces the pinching effect that is imposed upon the DMOS body 3.34 by the shallow N+ source region 3.35 and the N-type epi region 3.13. Both of those N-type regions pinch the effective resistance of the P-type DMOS body 3.34 and thereby increase its resistance. The shallow P+ layer 3.36 beneath the shallow N+ layer 3.35 reduces that resistance. However, it is important that the P+ layer 3.36 not wrap around the N+ diffusion 3.35 or else the threshold of the device would dramatically increase. This is insured by the oxide sidewall spacers 3.40 which keep the P+ region 3.36 from expanding beyond the boundaries of the N+ region 3.35.

Another feature of the invention is the enhancement of drain termination breakdown. It has been found that the P well 3.34 used to form the NMOS body is an ideal diffusion to use as a junction extension to increase the lateral breakdown voltage between the QVDMOS source array and the drain termination 3.16. In the source array 3.10, the result is that the drain termination breakdown is increased from 50 volts to about 80 volts by disposing a P well region 3.27 between the P-type body region 3.16 and the LOCOS oxide region 3.25. With the lateral breakdown voltage raised above the intrinsic source value, the QVDMOS performance can be optimized independently from lateral breakdown. For example, if no P well region 3.27 were used, the QVDMOS performance (i.e., when the QVDMOS is "on") would be compromised to achieve this high lateral breakdown.

Another advantage of the P well junction extensions 3.27, 3.18 over extensions used in typical discrete power processes is that the junctions 3.27, 3.18 may be implemented in the normal formation of the QVDMOS source array 3.30 and do not require any further masking step. As such, a narrow band of P wells 3.27, 3.18 to straddle the edge of LOCOS oxide 3.25. In this manner, the P wells 3.27, 3.18 are prevented from touching the deep N+ drain sinker 3.14 which, if contacted, would result in a much lower lateral breakdown. In addition, the P well 3.27 can be extended under the active area (non-LOCOS) which results in a slightly smaller design than if a junction extension were self-aligned to the LOCOS as is more commonly used.

Turning now to FIGS. 3E–3H, there will be described the simultaneous formation of QVDMOS, CMOS, and bipolar devices. With reference to FIG. 3E, a P-type substrate 3.11 is fabricated to have one or more N+ buried layers 3.26. A typical N+ buried layer is formed by implanting the surface of the P-type substrate with arsenic (As75) in a dose of $1.25 \times 10^{16}$ atoms/cm$^2$ with an implant energy of 40 KeV. Such buried N+ diffusions 3.26 may be fabricated in accordance with co-pending patent application Ser. No. 08/472,859 filed Jun. 7, 1995 that is assigned to the same assignee as this application and is herein incorporated by reference. The N+ buried layers 3.26 are separated by buried P+ regions 3.44. The P+ buried regions are formed by an ion implant using boron (B11) with a dose of $1.3 \times 10^{15}$ atoms/cm$^2$ at an implant energy of 30 KeV. An N epitaxial layer 3.13 is grown on the P-type substrate 3.11 as explained in my co-pending application Ser. No. 08/472,859 filed Jun. 7, 1995 and is herein incorporated by reference. The surface 3.15 of the epitaxial layer 3.13 is suitably masked and deep N+ regions are made to form regions 3.14, 3.75 in the surface 3.15 and contacting the N+ buried layer 3.26. Thereafter, the sinker diffusion mask is stripped and a P well oxide mask 3.38 is applied to the surface 3.15. Suitable openings are made in the masking oxide 3.38 for the formation of a P well 3.37 for the NMOS device and a P well 3.27 for the source drain determination of the QVDMOS device. A suitable implant is made, typically using boron 3.11 with a dose of $1.0 \times 10^{13}$ atoms/cm$^2$ at an energy of 100 KeV, and the implant is driven in to form the P wells 3.37, 3.27. Accordingly, in a single step p wells are formed for CMOS devices as well as for QVDMOS source drain terminations. The sinker also forms the collector diffusion for an NPN transistor.

Next, suitable openings are made for P+ isolation regions 3.47 that are subsequently covered by LOCOS oxide 3.25. The regions 3.47 are formed by masking the substrate and exposing selected isolation areas over the buried P+ regions 3.44. The selected areas are implanted with boron (B11) having a dose of $1.0 \times 10^{16}$ atoms/cm$^2$ with an energy of 50 KeV. The surface 3.15 is subsequently treated to provide a gate oxide 0.332 (not shown) and gates 3.24, 3.45, 3.46 for the QVDMOS and CMOS devices. Thus, the gate oxide for all the MOS devices is formed in one step and the gate metal for all MOS devices is formed in one step. After formation of the gates 3.24, 3.45, 3.46 the surface 3.15 is implanted with a lightly doped P-type implant such as boron. This P-type implant provides the body region 3.34 of the DMOS device, as well as the termination drain extension 3.16. That implant is formed with boron 3.11 having a dose of $5.6 \times 10^{13}$ atoms/cm$^2$ and an implant energy of 100 KeV. The same light P implant is used to form the lightly doped section 3.54 of the drain in the PMOS device. Accordingly, both the DMOS body and the lightly doped drain sections of the PMOS devices are simultaneously formed in one step. Those skilled in the art will appreciate that the surface 3.15 is suitably masked with photoresist of a suitable thickness in order to provide a barrier for the P-type ions from entering unwanted portions of the surface 3.15 of the substrate 3.11.

In a following step, a shallow N+ implant is used to form the NMOS source and drain 3.55, the PMOS body tie 3.56, and the QVDMOS sources 3.35 as well as the QVDMOS drain contact 3.60 to the drain sinker 3.14. This step is shown in FIG. 3G. The implant is arsenic (As75) with a dose of $7.0 \times 10^{15}$ atoms/cm$^2$ at an energy of 150 KeV. Likewise, the shallow, N+ implant is used to form the emitter 3.75 of the NPN transistor.

Next, as shown in FIG. 3H, a shallow P-type dopant such as boron is used to form the body ties 3.36 of the QVDMOS and thereby shunt the QVDMOS body resistance 3.34 to suppress snapback. The shallow P implant is boron (B11) having a dose of $3.0 \times 10^{15}$ atoms/cm$^2$ and having an implant energy of 60 KeV. At the same time, the P-type doping forms the sources and drains 3.66 for the PMOS device and the body tie 3.67 for the NMOS device. Accordingly, the single shallow P+ implant simultaneously forms the body ties, a portion of the drain extension, the PMOS sources and drains, and the NMOS body tie for the BICMOS device.

Those skilled in the art will appreciate that further steps are employed to complete the fabrication of a BICMOS device including a QVDMOS array, CMOS devices and bipolar devices. These further steps include the steps of siliciding the sources, drains and polysilicon gate regions, and emitter and base contacts; providing one or more suitable layers of interlevel metal dielectric isolation; and providing one or more layers of metal for contacting the terminals of the different devices including contacts for the sources, drains, gates, bases, emitters and collectors. Such further steps have been described above and are otherwise known to those skilled in the art.

QVDMOS Low Sheet Resistance Buried Layer

With reference to FIG. 4A, there is shown a substrate 4.10 comprising a P-type body of semiconductor material, preferably silicon. A photoresist layer 4.16 or other suitable masking layer coats the surface 4.13 of the P-type material 4.12. Ions 4.15 are implanted into the surface 4.13 through an opening 4.17 in the photoresist 4.16. The implanted ions form a heavily layered N+ buried layer 4.14 in the substrate 4.12.

The ions are implanted using a high dose, low energy arsenic implant. Arsenic is implanted with a dose in the range of $0.5-2 \times 10^{16}$ atoms/cm$^2$ and preferably a dose of $1.25 \times 10^{16}$ atoms/cm$^2$ at an implant energy in the range of 25–50 KeV and preferably at 40 KeV. The arsenic implant renders the surface 4.13 amorphous so that subsequent annealing provides solid phase epitaxial regrowth rather than mere diffusion of arsenic. Arsenic is selected as the implant because the size of the arsenic atoms is similar to the size of silicon atoms. As such, implanting arsenic into silicon with low energy minimizes the potential damage to the silicon monocrystalline lattice. In addition, arsenic has a low diffusion coefficient in silicon so the lateral diffusion of the arsenic implant will be limited. Other common N-type implants, such as phosphorus and antimony, are unsuitable for this process. Both have relatively large sized ions and phosphorus has a relatively high diffusion coefficients. Another desirable feature of the arsenic implant is that the arsenic atoms do not deeply penetrate the silicon substrate 4.12. This feature is an advantage during subsequent annealing steps as will be explained hereinafter.

Turning to FIG. 4B, after implantation, the photoresist 4.16 is stripped and the substrate 4.10 is annealed and the implanted region 4.14 is further diffused into the substrate 4.10. The annealing step serves several functions. During annealing, the ion damaged surface of the substrate 4.10 is effectively a morphous silicon. During annealing, that damage will be cured through a solid-phase epitaxial process. The underlying single crystal silicon provides a pattern from which the damaged region seeds. Since the arsenic does not deeply penetrate the silicon, the solid-phase epitaxial annealing takes place essentially at the surface 4.13 of the substrate 4.10, which is desirable.

In prior art processes, the implanted substrate 4.10 is often oxidized in order to create a step in the silicon surface 4.13. Those skilled in the art will appreciate that heavily doped silicon oxidizes at a rate substantially greater than lightly doped silicon. So, the implanted wafer can be oxidized after implantation in order to establish a step in the surface of the substrate 4.10 to define the implanted areas. However, with the invention, it is necessary to first anneal the substrate 4.10 before oxidizing to create an alignment mark.

During annealing (FIG. 4B) the surface 4.13 is repaired by solid-phase epitaxial regrowth and the arsenic ions are activated and partially diffused into region 4.12.

The high temperature anneal is done under an inert nitrogen ambient gas and at a low partial pressure of oxygen. Annealing occurs between 900 to 1250° C. and preferably at 1200° C. for between 1 to 24 hours, preferably five hours. Therefore, a 5,600 Angstrom thick oxide layer is grown in a 1000° C. steam oxidation step. This prevents pitting of the silicon surface which can occur on a bare silicon surface in a pure nitrogen atmosphere. It is to be noted that arbitrarily long diffusions of any dopant may produce very low, buried layer sheet resistance. However, such long exposure would laterally diffuse the buried layer 4.14 beyond acceptable boundaries. By using a suitable size dopant such as arsenic together with the high dose, low energy implant, the buried layer 4.14 does not diffuse laterally or vertically more than six microns from its original dimension. As such, the buried layer 4.14 has a junction depth D of about a range of 4–6 microns, preferably 5.4 microns.

Following the annealing of the N+ buried layer 4.14, one may implant a P+ buried layer using any suitable P-type implant, such as boron. Prior to implantation with P-type ions, the N+ buried layer is suitable masked with an oxide mask so that the exposed areas of the substrate receive the P-type implant. After P-type implantation is completed, all oxide is stripped from the surface 4.13 of the substrate 4.10 and the epitaxial layer 4.18 is grown on the substrate 4.10. The portion of the epitaxial layer 4.19 that is over the N+ region 4.14 is nearly defect free. Prior to growing the epitaxial layer 4.18, about 0.1 to 0.2 microns of the surface 4.13 of the substrate 4.10 is removed in a hydrochloric vapor etch. This removal of a thin surface layer of the substrate disposes of damaged surface material on top of the buried layer which would produce stacking faults during growth of the epitaxial layer.

During growth of the epitaxial layer 4.18, further steps are taken to minimize autodoping from the heavily doped N+ region 4.14 to adjacent undoped regions. Such autodoping would result in substrate breakdown voltage problems at sufficiently high voltage levels. During autodoping, arsenic ions are released from layer 4.14 and combined by diffusion with undoped areas 4.12. In the epi chamber, it is necessary to remove any arsenic dopant atoms liberated during the etch. Accordingly, epitaxial growth is conducted in an atmosphere and at a temperature favorable to low arsenic incorporation into the growing epitaxial layer. One may use any suitable source of silicon such as silane or silicon tetrachloride. The later is mixed with hydrogen to deposit (grow) epitaxial silicon. The hydrochloric gas byproduct is removed. The epi process is carried out at a temperature in the range of 1180–1225° C., for 10 to 10 minutes, preferably at 1,220° C. for about 5 minutes. In addition, the pressure may be reduced in the chamber so as to lessen arsenic autodoping.

Turning to FIG. 4C during epitaxial growth of layer 18, the surface 4.23 of the layer 4.18 is provided with alignment ridges 4.24, 4.25 in the surface. Otherwise, the epitaxial layer 4.18 grows in a substantially uniform manner over the N+ buried layer 4.14. Any suitable epitaxial reactor (horizontal, puncalse or barrel) may be used. As shown in FIG. 4D, a bipolar device 4.41 with N+ collector region 4.42 and a QVDMOS device with an N+ drain region are formed in the epitaxial layer 4.20. The buried layer 4.14 has a low sheet resistance of about 6.5 ohms per square and a lateral spread from its initial borders of about six microns.

Pilot Transistors

With reference to FIG. 5A, there is generally shown a QVDMOS power device 5.10. A source region 5.12 is bordered on either side by identical drain termination regions 5.14, 5.15. Adjacent to drain termination regions 5.14, 5.15 are drain sinker regions, respectively, 5.16, 5.18. The sources are typically circular diffusions 5.20 that are bounded by a gate 5.22 with an hexagonal symmetry profile. In other words, the locus of points in a path around a source that is equidistant from the source and its neighbors defines a hexagonal path.

With reference to FIG. 5B, the QVDMOS device 5.10 is built on a semi-conductor substrate, typically a p-type silicon 5.30. In the substrate 5.30 there is a highly doped N+ buried layer 5.32. On top of buried layer 5.32 there is a lightly doped N-type epitaxial layer 5.34. The layer 5.34 is grown on the substrate 5.30 above the buried layer 5.32. Identical source regions 5.20 have annular regions of shallow N+ doping. The sources 5.20 are disposed in P-well DMOS bodies 5.34. In the middle of the diffusions 5.20 is a body tie 5.26. Gates 5.22 surround the sources. The source array 5.12 is spaced from opposite longitudinally running drains 5.16 and 5.18. Each of the drains 5.16 and 5.18 comprise heavily doped N-type regions that extend from the surface of the device to the buried layer 5.32. Drain termination regions 5.14, 5.15 respectively space the drains 5.16, 5.18 from the source array 5.12. In operation, when the DMOS device is on, current flows from the sources through a channel made in the DMOS body 5.24 through the epitaxial layer 5.34 and into the buried layer 5.32. Current in the buried layer 5.32 flows laterally towards the drains 5.16, 5.18. Accordingly, in its "on" condition, the QVDMOS device 5.10 includes a number of resistances such as the resistance of the sources 20, the MOS body resistance 24, the resistance of the epi layer 33, the resistance of the buried layer 34, and the resistance of the drains 5.16, 5.18.

In general, the QVDMOS device 10 has a specific "on" resistance. $R_{spON}$, can be reasonably modeled over pertinent conditions by the following relationship:

$$R_{spON} = R_{spD} + \left(\frac{W_v + D}{2} + T\right) \quad (1)$$

$$\left\{R_{shBL}T + \sqrt{(R_{spMOS} + R_{spEPI}) \cdot R_{shBL}}\ ctnh\left(\sqrt{\frac{R_{shBL}}{(R_{spMOS} + R_{spEPI})}}\right.\right.$$

where
$R_{spD}$=effective drain sinker specific resistance (ohm*cm$^2$)
$R_{shBL}$=N+ buried layer sheet resistance (ohm/square)
$R_{spMOS}$=effective MOS specific resistance (ohm*cm$^2$)
$R_{spEPI}$=effective epi drift region specific resistance (ohm*cm$^2$)

The dimensions W, V T, and L are as in FIG. 5A. Each R component above exhibits its own unique bias, temperature, and process variations. $R_{spMOS}$ (region 24) is the most variable in the range of pertinent operation for power switches; it may vary by as much as 5:1 with changes in gate bias being the most important source of variation. $R_{spEPI}$ (layer 5.34) is also important in its variation, especially with process (i.e. epi thickness and doping) and temperature.

Both $R_{shBL}$ (layer 5.32) and $R_{spD}$ (drains 5.16, 5.18) are heavily doped silicon and have small to negligible variation with temperature and bias. $R_{spD}$ is typically a very small portion of the total power device number. $R_{shBL}$, on the other hand, is an important element accounting for about 35% of the total power device resistance, so process variations in $R_{shBL}$ are important to accurate pilot devices. The hyperbolic cotangent term accounts for the distributed nature of the vertical DMOS by way of a distributed resistance line model. Under normal operating conditions for an optimized power device, the hyperbolic cotangent can be linearized as below.

$$R_{spON} = \qquad (2)$$
$$R_{spD} + \left(\frac{W_v + D}{2} + T\right)\left\{R_{shBL}T + \frac{2}{W_v}(R_{spMOS} + R_{spEPI}) + \frac{W_v}{3}R_{shBL}\right\}$$

The smallest pilot device would be based on a single source window. As such it would be well described by a lumped element circuit model with $$R_{pON} = R_{pD} + R_{pBL} + Rp_{MOS} + R_{pEPIs} + R_{pEPId} \qquad (3)$$

The resistor components are specific to the pilot geometry with the same physical origins as in the full device expression indicated by the subscripts. FIG. 5C shows a general layout of a pilot with these elements. Details of the bias and temperature dependence may still depend on the device geometry, especially for $R_{pMOS}$ and $R_{pEPI}$. The key to matching pilot and power device performance is to have the relative ratios of the four primary resistor elements the same in both devices. Then any variations in any term, to first order, will have the same impact on both the power and pilot devices.

The $R_{pMOS}$ element is best matched by forming a single source window and terminating the gate such that the symmetry lines of the QVDMOS source array are simulated in the pilot. This is easily done by ending the gate electrode 5.122, with appropriate termination, at the symmetry lines. Such a construction duplicates most of the important geometries that determine this component's behavior at low drain bias. At high drain bias the terminating junction will contribute a depletion spread not present in the power device. However, for most piloting of power switches, only the low drain bias conditions are important since the switch is not intended to sustain high conductance and high voltage simultaneously.

The $R_{pEPIs}$ term also benefits from the single source window construction. However, another geometric discrepancy between pilot and power devices becomes apparent. In the power device 5.10, symmetry confines the current from crossing the source array symmetry lines (except at edges of the vertical section). In other words, the current travels an almost vertical path to the buried layer 5.32. In the pilot, the absence of surrounding sources allows the current to spread beyond the source array symmetry lines and it proceeds from the surface to the N+ buried layer. See arrows 5.130 in FIG. 5D. This current spreading reduces $R_{pEPIs}$ below the level required by the component ratios in the power device. That is why a $R_{pEPId}$ term was added to the pilot expression. This term is added by providing another section of vertical current flow through the epi, sized accordingly to add the extra epi resistance needed raise the total $R_{pEPI}$ component to the needed value. This path can replace the drain sinker 5.118 (if that term is small enough) or it can be just an extra element in the pilot design. The final term, $R_{pBL}$, is present in the power device due to the distributed drain collection term (with the $W_v/3$ factor) and the drain termination term (with the T factor). Since neither mechanism is inherent in the pilot, care must be taken to include an appropriate N+ buried layer resistor 5.132 to provide this important component. This is clearly shown in FIGS. 5C and 5D.

Turning to FIGS. 5C and 5D, there is shown a pilot transistor 5.100 that satisfactorily tracks the QVDMOS device 5.10. The source 5.120 is a shallow N+ source that is simultaneously formed with the sources 5.20 of the QVDMOS device 5.10 on an area of the substrate 5.30 spaced from the QVDMOS device 5.10. The source 5.120 is surrounded by an approximate hexagonal gate 5.122 in order to maintain the symmetry of the gate source relationship as found between sources 5.20 and gates 5.22 in the QVDMOS device 5.10. Likewise, the drain region 5.18 is also patterned to have an hexagonal shape. The symmetry between the approximate hexagonal shape of the drain region 5.118 and the gate 5.22 allows the drain region 5.118 to concentrate the current flowing from the buried layer 5.32 as will be explained hereinafter.

The source region 5.120 is formed in a lightly P doped DMOS body 5.124 that is simultaneously fabricated with the DMOS body 5.124 of the source array cells 5.20. The DMOS body 5.124 is formed in the same epitaxial layer 5.34 and has the same light N-type doping as the epitaxial layer 5.34 that holds the source bodies 5.24. The buried layer resistor 5.132 is the same buried layer found in the DMOS device 5.32. An optional region 5.116 is found in the drain diffusion 5.118. The drain diffusion 5.118 can be fabricated to have a suitable drain resistance to compensate for the current spread from the source. As shown by arrows 5.130, current from the source tends to spread out laterally in its downward passage towards the buried layer 5.32. As a result, the effective resistance of the epitaxial region 34 is reduced in the pilot transistor 5.130. This reduction in effective epitaxial resistance would render the pilot transistor inconsistent with the operation and the "on" resistance of the QVDMOS device 5.10. So, to compensate for this spread in current, the shallow P+ drain region 5.118 is formed in an hexagonal shape in order to concentrate current from the buried layer 5.132 at the surface 5.50. As such, the symmetrical arrangement tends to provide an "inverse lampshade" for the current from the buried layer resistor 5.132. So, while the current 5.130 spreads out from the source and reduces resistance, the hexagonal shape of the drain 5.118 tends to concentrate the current along lines 5.134 and increases resistance. In an alternative embodiment, a further resistance could be added in series with the drain 5.118 such further resistance would increase the total on resistance of the pilot device 5.100 and make up for any remaining differences in the reduction of resistance due to the lateral spreading of current from the source 5.120.

In summary, the invention provides a suitable pilot transistor 5.100 that mimics the operation of the DMOS device 5.10. The isolated pilot transistor 5.100 employs symmetry in the formation of the gate and the drain and thereby compensates for the lack of symmetry due to the single source isolated from the array. In order to finally compensate for reduced resistance due to current spreading from the source, an epitaxial resistance is added to the drain region and thereby compensates for reduced drift region resistance.

Having disclosed one or more preferred embodiments of the invention, those skilled in the art will appreciate that further modifications, additions and changes thereto may be made without departing from the spirit and scope of the invention as set forth in the following claims. More specifically, the approximate hexagonal shape of the gate 5.122 and drain 5.118 is not critical. Other symmetrical shapes may be used, including, by way of example a circle or an octagon.

The invention claimed is:

1. An active speaker comprising:
   a speaker with a monolithic integrated circuit operatively connected to the speaker for providing a power signal to drive the speaker, said monolithic integrated circuit for providing a class D amplifier function, said monolithic integrated circuit comprising
      a conditioning circuit having an input for receiving an audio input frequency signal and generating an output series of class D amplifier conditioning pulses representative of the amplitude and the frequency of the audio input signal, said output series of pulses having a frequency substantially greater than said audio frequency;
      a bridge driver circuit, formed from a first transistor type, having an input for receiving the output series of class D amplifier conditioning pulses and translating a voltage level of the pulses to a driver voltage level, and means for generating a power MOSFET gate driver signal comprising a series of output driver pulses having pulse widths proportional to the sampled audio signal and pulse amplitudes at the driver voltage level; and
      a bridge circuit comprising a plurality of power MOSFET devices of a second, different transistor type for receiving the output power driving pulses from the bridge driver circuit, means for applying the power driver pulses to the gates of the power MOSFETs to generate output power voltage pulses at a power voltage level.

2. The active speaker of claim 1 wherein the conditioning circuit comprises means for receiving an audio frequency input signal, means for sampling the audio input signal at a frequency substantially greater than the highest audio frequency in the audio input signal, and means for comparing the sampled audio signal to a reference voltage signal to provide an output series of class D amplifier conditioning width modulated pulses, each pulse having the amplitude of the reference voltage signal and a width proportional to the amplitude of the sampled audio signal.

3. The active speaker of claim 1 wherein the conditioning circuit comprises means for receiving an audio frequency input signal, means for sampling the audio input signal at a frequency substantially greater than the highest audio frequency in the audio input signal, and means for generating an output series of class D amplifier density modulated pulses, each pulse having the amplitude of the reference voltage signal and a density proportional to the amplitude of the sampled audio signal.

4. An active speaker comprising:
   a speaker with a monolithic integrated circuit operatively connected to the speaker for providing a power signal to drive the speaker, said monolithic integrated circuit comprising
      a bridge driver circuit, formed from a first transistor type, having an input for receiving an output series of class D amplifier conditioning pulses and translating a voltage level of the pulses to a driver voltage level, and means for generating a power MOSFET gate driver signal comprising a series of output driver pulses having pulse widths proportional to the sampled audio signal and pulse amplitudes at the driver voltage level;
      a bridge circuit comprising a plurality of power MOSFET devices of a second, different transistor type for receiving the output power driving pulses from the bridge driver circuit, means for applying the power driver pulses to the gates of the power MOSFETs to generate output power voltage pulses at a power voltage level.

5. The active speaker of claim 4 wherein the bridge driver comprises a plurality of amplifiers for generating the power MOSFET gate driver signals and each amplifier comprises a power MOS switch, said power MOS switch comprising:
   four drain regions spaced from each other;
   a common gate enclosing the drain regions; and
   a source region centrally located among the drain regions, said source region comprising a pair of elongated source distribution regions disposed transverse to each other, adjacent the common enclosing gate and between adjacent drain regions.

6. The active speaker of claim 4 wherein the bridge driver circuit comprises a monolithic integrated circuit comprising:
   a plurality of amplifiers for generating the power MOSFET gate driver signals and each amplifier comprises a power MOS switch comprising an array of MOS transistors wherein said array comprises a waffle pattern of drain regions and gate regions and a source distribution region comprising:
   a central source distribution region having first and second elongated source distribution regions disposed transverse to each other and defining four quadrants, each quadrant disposed between a first and second source distribution region;
   four drain regions, one drain regions being located in each quadrant; and
   one or more gate regions separating the drain regions from the source distribution regions.

7. The active speaker of claim 6 wherein the monolithic integrated circuit comprises a common gate region enclosing all said drain regions.

8. The active speaker of claim 7 wherein the gate region extends at least between drain regions in quadrants on one side of one of the source distribution regions.

9. The active speaker of claim 6 wherein the bridge driver circuit comprises a plurality of amplifiers for generating the power MOSFET gate driver signals and each amplifier comprises a power MOS switch comprising:
   an array of MOS devices, said array comprising alternating drain columns and source columns;
   each drain column comprising a plurality of separate drain regions closely spaced one from another;
   each source column comprising a continuous narrow elongated source distribution region extending the length of the column and a plurality of narrow source distribution branch regions connected to said elongated region and extending transversely from said elongated region at least partially between each separate drain region in each drain column adjacent to said source column; and
   a gate region separating the drain regions in each said drain column from the adjacent source distribution regions.

10. An active speaker comprising:
    a speaker,
    a monolithic integrated circuit operatively coupled to the speaker, said monolithic integrated circuit comprising:
       a bridge circuit having a plurality of power MOSFET devices of a first transistor type, said bridge circuit operative to receive driver pulses from a bridge driver circuit, formed from a second, different transistor type; and means for applying said driver pulses to gates of the power MOSFET devices, said driver pulses and said power MOSFET devices operative to generate output power voltage pulses at a power voltage level.

11. The active speaker of claim 10 wherein the bridge circuit comprises two or more quasi-vertical DMOS (QVDMOS) transistors, each QVDMOS transistor comprising:
   a substrate region having a first conductivity;
   a buried layer in said substrate of a second conductivity and heavily doped;
   an epitaxial layer of a second conductivity on said substrate and over said buried layer;
   a drain region extending from the source of the epitaxial layer to the buried layer and having a second conductivity;
   a body region formed in the surface of the epitaxial layer, spaced from said drain region and having a first conductivity;
   a source region formed in said body region, having a shallow depth and having a second conductivity;
   a body tie formed in the source region, having a first conductivity, a depth slightly greater than the depth of the source region and extending under and not beyond the source region; and
   a gate insulated from the epitaxial layer and extending over the source and body regions.

12. The active speaker of claim 11 wherein each QVDMOS transistor comprises an annular source region.

13. The active speaker of claim 11 wherein each QVDMOS transistor comprises a body tie disposed within the annular source region.

14. The active speaker of claim 11 wherein each source and each body tie are silicided.

15. The active speaker of claim 11 wherein each source and body tie are self-aligned with the gate.

16. The active speaker of claim 11 wherein each QVDMOS gate comprises a dielectric layer in contact with the surface of the epitaxial layer and a conductive layer in contact with the dielectric layer.

17. The active speaker of claim 11 wherein the body tie and the source regions have a high conductivity and the body tie serves as a low resistance path between the body region and the surface of the epitaxial layer.

18. The active speaker of claim 10 wherein each said power MOSFET devices are QVDMOS transistors said QVDMOS transistors comprising:
   an epitaxial layer formed on a semiconductor substrate and wherein at least a portion of said epitaxial layer is positioned over a buried layer;
   wherein said buried layer contains dopant ions of a size similar to the size of the atoms of the semiconductor material; and
   wherein said buried layer has a sheet resistance of less than 15 ohms per square.

19. The active speaker of claim 18 wherein the monocrystalline semiconductor substrate has a sheet resistance of about 6.5 ohms per square.

20. The active speaker of claim 18 wherein the semiconductor material is silicon and the buried layer comprises arsenic.

21. The active speaker of claim 18 wherein the depth of the buried layer is about 5.4 microns below an interface of the substrate and the epitaxial layer.

22. The active speaker of claim 18 wherein the lateral diffusion of the buried layer is less than six microns.

23. The active speaker of claim 18 wherein said buried layer has a sheet resistance of about 6.5 ohms per square.

* * * * *